United States Patent
Ohashi et al.

(10) Patent No.: US 10,586,862 B2
(45) Date of Patent: Mar. 10, 2020

(54) SEMICONDUCTOR DEVICE

(71) Applicant: Kabushiki Kaisha Toshiba, Minato-ku (JP)

(72) Inventors: Teruyuki Ohashi, Kawasaki (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/225,137

(22) Filed: Aug. 1, 2016

(65) Prior Publication Data

US 2017/0047440 A1    Feb. 16, 2017

(30) Foreign Application Priority Data

Aug. 11, 2015 (JP) ................. 2015-159199

(51) Int. Cl.
*H01L 29/78* (2006.01)
*H01L 29/16* (2006.01)
*H01L 29/10* (2006.01)
*H01L 29/66* (2006.01)
*H01L 21/04* (2006.01)

(52) U.S. Cl.
CPC ...... *H01L 29/7813* (2013.01); *H01L 21/0465* (2013.01); *H01L 29/1095* (2013.01); *H01L 29/1608* (2013.01); *H01L 29/66068* (2013.01)

(58) Field of Classification Search
CPC ....... H01L 29/66666; H01L 29/66712–66734; H01L 29/7802–7815; H01L 29/7827–7828; H01L 51/057; H01L 21/823885; H01L 29/0696; H01L 29/1095; H01L 29/66325; H01L 29/7393–7395; H01L 29/7397; H01L 2924/13055; H01L 29/78642
See application file for complete search history.

(56) References Cited

U.S. PATENT DOCUMENTS 5,072,266 A    12/1991    Bulucea et al.
5,168,331 A *  12/1992    Yilmaz ............... H01L 29/0623
                                                 257/331
(Continued)

FOREIGN PATENT DOCUMENTS

CN    101060081 A    10/2007
CN    101536163 A    9/2009
(Continued)

*Primary Examiner* — Cuong B Nguyen
(74) *Attorney, Agent, or Firm* — Oblon, McClelland, Maier & Neustadt, L.L.P.

(57) ABSTRACT

A semiconductor device according to embodiments includes, a SiC substrate, SiC layer, a trench having a side face and a bottom face, a first conductivity type first SiC region, a second conductivity type second SiC region between the first SiC region and the SiC substrate, a first conductivity type third SiC region between the second SiC region and the SiC substrate, a boundary between the second SiC region and the third SiC region provided at a side of the side face, the boundary including a first region, a distance between the first region and a front face of the SiC layer increasing as a distance from the side face to the first region increasing, and distance from the side face to the first region being 0 μm or more and 0.3 μm or less, a gate insulating film and gate insulating film.

31 Claims, 18 Drawing Sheets

(56) References Cited

U.S. PATENT DOCUMENTS

| | | | | |
|---|---|---|---|---|
| 5,821,583 | A * | 10/1998 | Hshieh | H01L 29/1095 |
| | | | | 257/330 |
| 2006/0281249 | A1* | 12/2006 | Yilmaz | H01L 29/66727 |
| | | | | 438/243 |
| 2007/0243722 | A1* | 10/2007 | Nakamura | H01L 21/049 |
| | | | | 438/787 |
| 2009/0114969 | A1 | 5/2009 | Suzuki et al. | |
| 2009/0311839 | A1 | 12/2009 | Miyahara et al. | |
| 2013/0240906 | A1* | 9/2013 | Shimizu | H01L 29/1608 |
| | | | | 257/77 |

FOREIGN PATENT DOCUMENTS

| | | |
|---|---|---|
| JP | 2001-339063 A | 12/2001 |
| JP | 2005-57059 | 3/2005 |
| JP | 2009-117593 | 5/2009 |
| JP | 2009-260253 A | 11/2009 |
| JP | 2009-302436 | 12/2009 |
| JP | 2010-098326 A | 4/2010 |
| JP | 4562362 | 10/2010 |
| JP | 2012-164707 A | 8/2012 |
| JP | 2012-178536 A | 9/2012 |
| JP | 2013-084899 A | 5/2013 |
| JP | 2013-93560 A | 5/2013 |
| JP | 2013-201361 A | 10/2013 |
| JP | 2013-214658 | 10/2013 |
| JP | 2013-214661 | 10/2013 |
| JP | 2015-056542 A | 3/2015 |
| WO | WO 2006/135746 A2 | 12/2006 |
| WO | WO 2014/061367 A1 | 4/2014 |

* cited by examiner

SEMICONDUCTOR DEVICE

CROSS-REFERENCE TO RELATED APPLICATION

This application is based upon and claims the benefit of priority from Japanese Patent Application No. 2015-159199, filed on Aug. 11, 2015, the entire contents of which are incorporated herein by reference.

FIELD

Embodiments described herein relate generally to a semiconductor device.

BACKGROUND

SiC (silicon carbide) is expected to serve as a material for a next-generation semiconductor device. SiC has more excellent physical properties in comparison with Si (silicon): band gap, three times; breakdown field strength, approximately ten times; and thermal conductivity, approximately three times. A low loss semiconductor device which can operate at a high temperature can be realized by using such properties.

However, for example, in the case where a metal insulator semiconductor (MIS) structure is formed by using SiC, since a breakdown voltage of SiC is high, a breakdown voltage of a gate insulating film may become lower than a breakdown voltage of a semiconductor. Especially, in the case where the MIS structure is formed in a trench to increase integrity of the device, there is a problem that a breakdown voltage of the gate insulating film is decreased by electric field concentration at a bottom of the trench.

DETAILED DESCRIPTION

Figure 1:
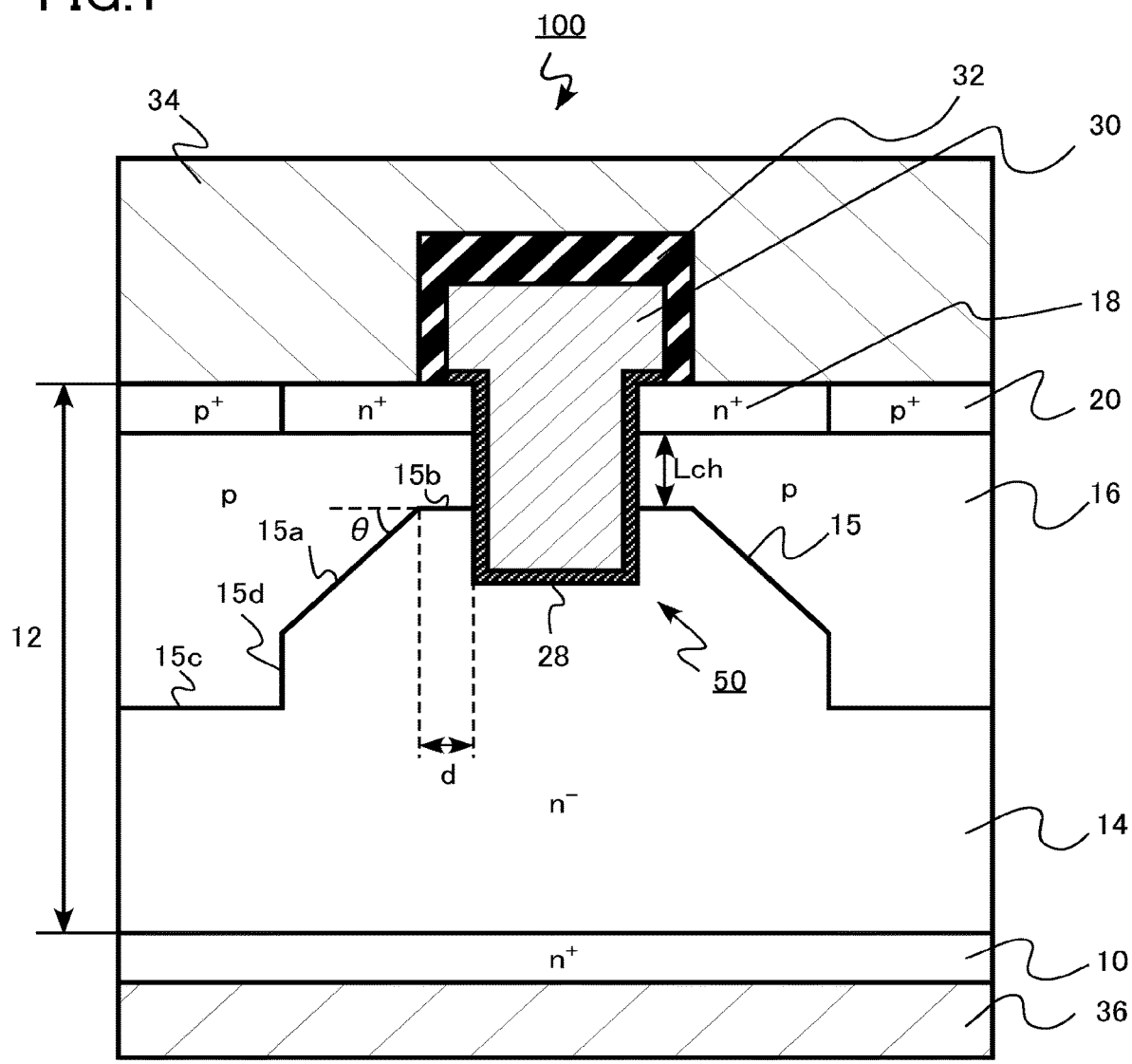
FIG. 1 is a schematic sectional view of an example of a semiconductor device according to a first embodiment.

A semiconductor device, comprising: a SiC substrate; a SiC layer provided on the SiC substrate, the SiC layer including a first trench at a side of front face of the SiC layer, the first trench including a side face and a bottom face; a first conductivity type first SiC region provided in the SiC layer; a second conductivity type second SiC region provided between the first SiC region and the SiC substrate in the SiC layer; a first conductivity type third SiC region provided between the second SiC region and the SiC substrate in the SiC layer, a boundary between the second SiC region and the third SiC region disposed at a side of the side face of the first trench, the boundary including a first region, a distance between the first region and the front face of the SiC layer increasing as a distance from the side face of the first trench to the first region increasing, a distance between the side face of the first trench to an end of the first region close to the first trench being 0 µm or more and 0.3 µm or less; a gate insulating film provided on the side face and the bottom face of the first trench; and a gate electrode, the gate insulating film disposed between the gate electrode and the first SiC region, the second SiC region, and the third SiC region.

Embodiments of the present disclosure will be described below with reference to drawings. In description below, same or similar members will be denoted by same reference characters, and description of members already described will be appropriately omitted.

Further, in description below, symbols of $n^+$, n, $n^-$ and $p^+$, p, $p^-$ indicate relative height of an impurity concentration in each conduction type. Specifically, $n^+$ indicates that an impurity concentration of an n-type is relatively higher than n, and $n^-$ indicates that the impurity concentration of the n-type is relatively lower than n. Furthermore, $p^+$ indicates that an impurity concentration of a p-type is relatively higher than p, and $p^-$ indicates that the impurity concentration of the p-type is relatively lower than p. An $n^+$-type and an $n^-$-type may be simply written as an n-type, and a $p^+$-type and a $p^-$-type may be simply written as a p-type.

First Embodiment

A semiconductor device according to a first embodiment includes, a SiC substrate; a SiC layer provided on the SiC substrate, the SiC layer including a first trench at a side of front face of the SiC layer, the first trench including a side face and a bottom face; a first conductivity type first SiC region provided in the SiC layer; a second conductivity type second SiC region provided between the first SiC region and the SiC substrate in the SiC layer; a first conductivity type third SiC region provided between the second SiC region and the SiC substrate in the SiC layer, a boundary between the second SiC region and the third SiC region disposed at a side of the side face of the first trench, the boundary including a first region, a distance between the first region and the front face of the SiC layer increasing as a distance from the side face of the first trench to the first region increasing, a distance between the side face of the first trench to an end of the first region close to the first trench being 0 μm or more and 0.3 μm or less; a gate insulating film provided on the side face and the bottom face of the first trench; and a gate electrode, the gate insulating film disposed between the gate electrode and the first SiC region, the second SiC region, and the third SiC region.

FIG. 1 is a schematic sectional view of an example of a configuration of a MISFET which is a semiconductor device according to the present embodiment.

A MISFET 100 is an n-type MISFET in which an electron is a carrier. The MISFET 100 is a vertical type device. The MISFET 100 is a trench-gate type MISFET in which a gate insulating film and a gate electrode are provided in a trench.

The MISFET 100 includes a SiC substrate 10, a SiC layer 12, a drift region (third SiC region) 14, an boundary 15, a first region 15a, a second region 15b, a third region 15c, a fourth region 15d, a p-well region (second SiC region) 16, a source region (first SiC region) 18, a p-well contact region (fourth SiC region) 20, a gate insulating film (insulating film) 28, a gate electrode 30, an interlayer insulating film 32, a source electrode (first electrode) 34, a drain electrode (second electrode) 36, and a trench (first trench) 50.

In the present description, with respect to faces of such as the SiC substrate 10, a face on an upper side in FIG. 1 is called a front face, and a face on a lower side is called a back face.

The MISFET 100 includes the n+-type SiC substrate 10. The SiC substrate 10 is, for example, a SiC substrate of 4H—SiC including N (nitrogen) as an n-type impurity. An impurity concentration of an n-type impurity is, for example, $1 \times 10^{18}$ cm$^{-3}$ or more and $1 \times 10^{20}$ cm$^{-3}$ or less. The SiC substrate 10 functions as a drain region of the MISFET 100.

A front face of the SiC substrate 10 is, for example, a face inclined at 0° or more and 10° or less with respect to a (0001) face (silicon face). A back face of the SiC substrate 10 is, for example, a face inclined at 0° or more and 10° or less with respect to a (000-1) face (carbon face).

The SiC layer 12 is provided on the SiC substrate 10. The SiC layer 12, for example, includes N (nitrogen) as an n-type impurity. A concentration of the n-type impurity in the SiC layer 12 is, for example, $1 \times 10^{14}$ cm$^{-3}$ or more and $1 \times 10^{17}$ cm$^{-3}$ or less. The SiC layer 12 is, for example, an epitaxial layer of SiC formed on the SiC substrate 10 by epitaxial growing.

A front face or surface of the SiC layer 12 is a face inclined at 0° or more and 10° or less with respect to a silicon face. A film thickness of the SiC layer 12 is, for example, 5 m or more and 150 μm or less.

The SiC layer 12 includes a trench 50 extending toward the SiC substrate 10 from a front face of the SiC layer 12 and including a side face and a bottom face. The trench 50 is disposed at a surface side of the SiC layer The drift region (third SiC region) 14, the p-well region (second SiC region) 16, the source region (first SiC region) 18, the p-well contact region (fourth SiC region) 20 are provided in the SiC layer 12.

The n−-type drift region 14 is provided between the p-well region 16 and the SiC substrate 10. The drift region 14, for example, includes N (nitrogen) as an n-type impurity. A concentration of the n-type impurity in the drift region 14 is, for example, $1 \times 10^{14}$ cm$^{-3}$ or more and $1 \times 10^{17}$ cm$^{-3}$ or less.

A p-type p-well region 16 is provided between the source region 18 and the SiC substrate 10. The p-well region 16 functions as a channel region of the MISFET 100.

The p-well region 16, for example, includes Al (aluminum) as a p-type impurity. A concentration of the p-type impurity in the p-well region 16 is, for example, $5 \times 10^{15}$ cm$^{-3}$ or more and $1 \times 10^{18}$ cm$^{-3}$ or less. The depth of the p-well region 16 is, for example, 0.6 μm or more and 1.2 μm or less.

The n+-type source region 18 is provided in the p-well region 16. A part of the source region 18 comes into contact with a front face of the SiC layer 12.

The source region 18, for example, includes N (nitrogen) as an n-type impurity. A concentration of the n-type impurity in the source region 18 is, for example, $1 \times 10^{18}$ cm$^{-3}$ or more and $1 \times 10^{22}$ cm$^{-3}$ or less. The depth of the source region 18 is shallower than the depth of the p-well region 16. The depth of the source region 18 is, for example, around 0.3 μm.

Further, the p+-type p-well contact region 20 is provided in the p-well region 16. The p-well contact region 20 is provided on a side of the source region 18.

The p-well contact region 20, for example, includes Al (aluminum) as a p-type impurity. A concentration of the p-type impurity in the p-well contact region 20 is higher than a concentration of a p-type impurity in the p-well region 16. For example, the concentration is $1 \times 10^{18}$ cm$^{-3}$ or more and $1 \times 10^{22}$ cm$^{-3}$ or less. The depth of the p-well contact region 20 is shallower than the depth of the p-well region 16 and, for example, around 0.3 μm.

The trench 50 is provided in the SiC layer 12. The trench extends toward the SiC substrate 10 from the front face of the SiC layer 12. A side face of the trench 50 is, for example, an m face or an a face. The depth of the trench 50 is shallower than a maximum depth of the p-well region 16.

A boundary 15 between the p-well region 16 and the drift region 14 provided at a side of the side face of the trench 50. The boundary 15 between the p-well region 16 and the drift region 14 comes into contact with a side face of the trench 50. The boundary 15 between the p-well region 16 and the drift region 14 includes the first region 15a, the second region 15b, the third region 15c, and the fourth region 15d. An interior angle of the p-well region 16 at the boundary 15 is 90° or more.

A distance between a front face of the SiC layer 12 and the first region 15a increases as a distance from the trench 50 to the first region 15a increases. The first region 15a has a first inclination angle (θ in FIG. 1). The first inclination angle (θ in FIG. 1) is larger than 0°. The first inclination angle may be 15° or more and 70° or less. The first region 15a may have a first position and a second position. The first position is closer to the trench 50 than the second position. A distance between the second position and the front face of the SiC layer 12 is larger than a distance between the first position and the front face of the SiC layer 12. A distance between the second position and a back face of the SIC substrate 10 is smaller than a distance between the first position and the back face of the SiC substrate 10. A shortest distance between the first region 15a and a side face of the trench (d in FIG. 1) is 0 μm or more and 0.3 μm or less. A distance between the side face of the trench 50 to an end of the first region 15a close to the first trench (d in FIG. 1) is 0 μm or more and 0.3 μm or less.

The second region 15b is substantially parallel to a front face of the SiC layer 12. The second region 15b is provided between the first region 15a and the trench 50. The second region 15b comes into contact with a side face of the trench 50.

The third region 15c is substantially parallel to a front face of the SiC layer 12. The first region 15a is provided between the third region 15c and the trench 50.

The fourth region 15d is substantially perpendicular to a front face of the SiC layer 12. The first region 15a is provided between the fourth region 15d and the trench 50. The fourth region 15d is provided between the third region 15c and the first region 15a.

A shape of the boundary 15 between the p-well region 16 and the drift region 14 can be monitored, for example, by a scanning capacitance microscopy.

The gate insulating film 28 is provided on a side face and a bottom face of the trench 50. At least a part of the gate insulating film 28 comes into contact with the source region 18, the p-well region 16, and the drift region 14. The gate insulating film 28 is provided between the SiC layer 12 and the gate electrode 30.

For example, an oxide film is used for the gate insulating film 28. For example, a silicon oxide film, a silicon oxynitride film, or a high-k insulating film can be used for the gate insulating film 28.

The gate electrode 30 is provided on the gate insulating film 28. For example, doped polysilicon can be used for the gate electrode 30.

The interlayer insulating film 32 is provided on the gate electrode 30. The interlayer insulating film 32 is formed of, for example, a silicon oxide film.

The source electrode 34 is provided on the SiC layer 12. A source electrode 34 is electrically connected to the source region 18 and the p-well contact region 20. The source electrode 34 functions as a p-well electrode which applies a potential to the p-well region 16.

The source electrode 34 is a conductive material. The source electrode 34 is, for example, metal or metal silicide. The source electrode 34 has a lamination structure of, for example, a nickel silicide layer and an aluminum (Al) layer on the nickel silicide layer.

The drain electrode 36 is provided on a side opposite to the SiC layer 12 of the SiC substrate 10, specifically on a back face side. The drain electrode 36 is electrically connected to the SiC substrate 10.

The drain electrode 36 is a conductive material. The drain electrode 36 is, for example, metal or metal silicide. The drain electrode 36 has a lamination structure of, for example, a nickel silicide layer and a gold (Au) layer on the nickel silicide layer.

In the present embodiment, an n-type impurity is preferably such as N (nitrogen) and P (phosphorus). However, such as As (arsenic) or Sb (antimony) is applicable. Further, a p-type impurity is preferably such as Al (aluminum). However, such as B (boron), Ga (gallium), or In (indium) is applicable.

Figure 2:
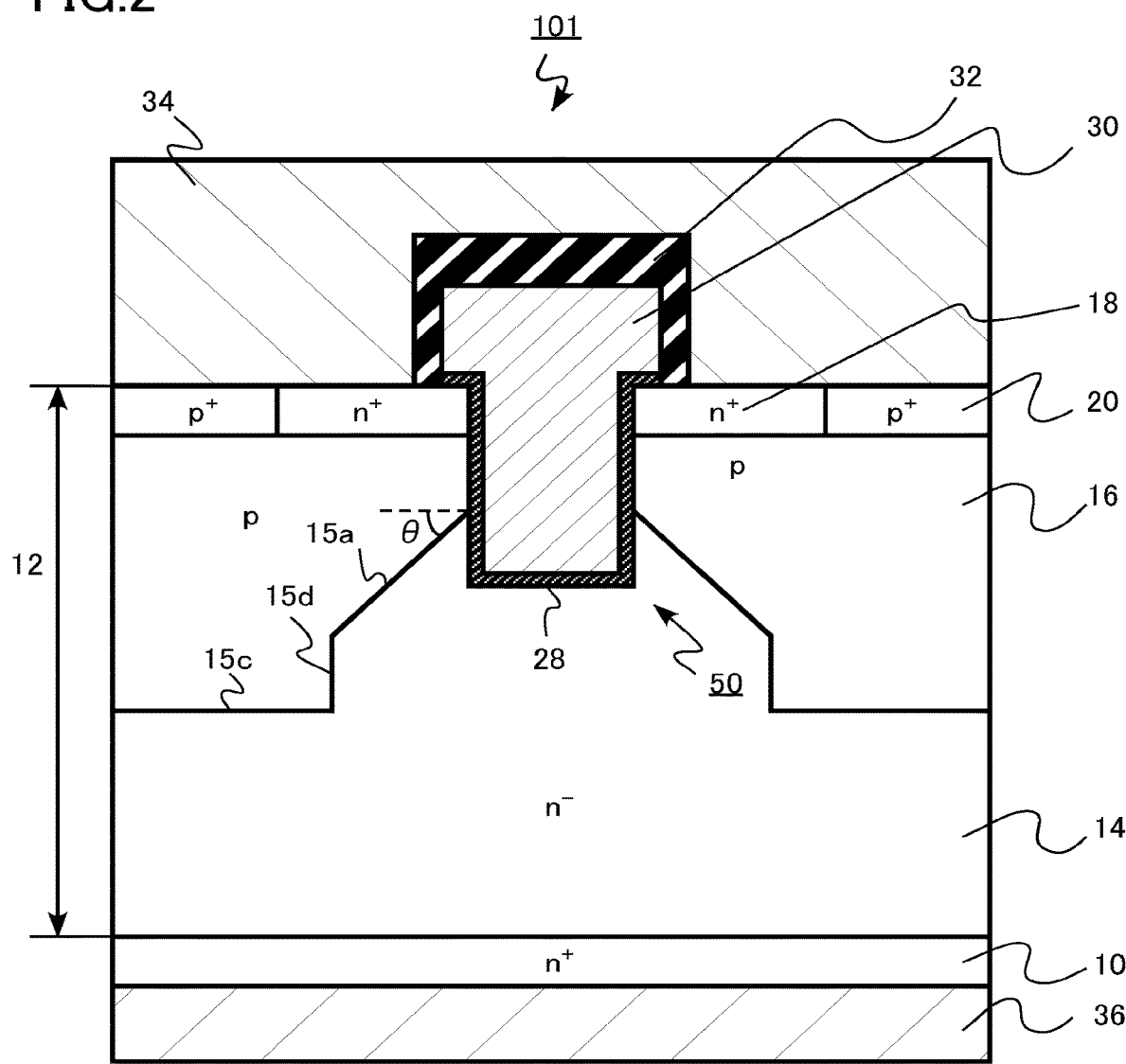
FIG. 2 is a schematic sectional view of an another example of the semiconductor device according to the first embodiment.

FIG. 2 is a schematic sectional view illustrating another example of a configuration of a MISFET which is a semiconductor device according to the present embodiment.

A MISFET 101 indicates a state in which a distance between the first region 15a and a side face of the trench 50 is 0 μm. Specifically, the MISFET 101 does not include the second region 15b, and the first region 15a directly contacts with a side face of the trench 50.

Next, an example of a semiconductor device manufacturing method according to the present embodiment will be described. FIGS. 3 to 7 are schematic sectional views of a semiconductor device in manufacturing by the semiconductor device manufacturing method according to the present embodiment.

Figure 3:
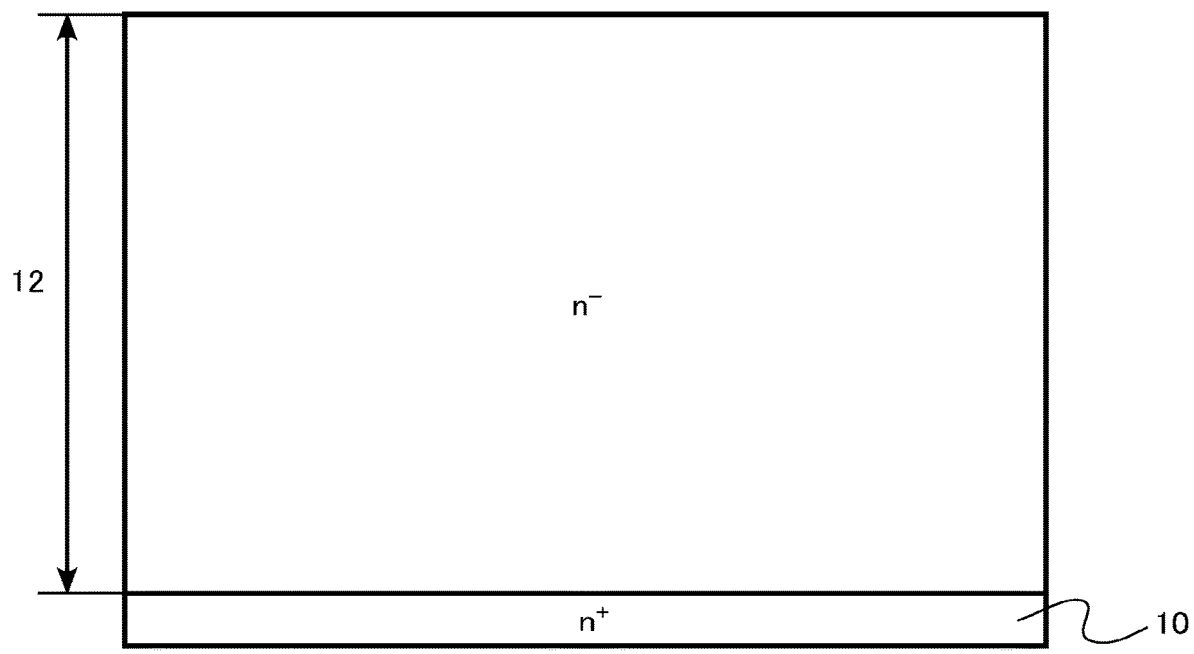
FIG. 3 is a schematic sectional view of a semiconductor device in manufacturing according to the first embodiment.

First, an n$^+$-type SiC substrate 10 is prepared which includes a front face which is a silicon face and a back face which is a carbon face. Next, an n$^-$-type SiC layer 12 is formed on the front face of the SiC substrate 10 by an epitaxial growth method (FIG. 3).

Figure 4:
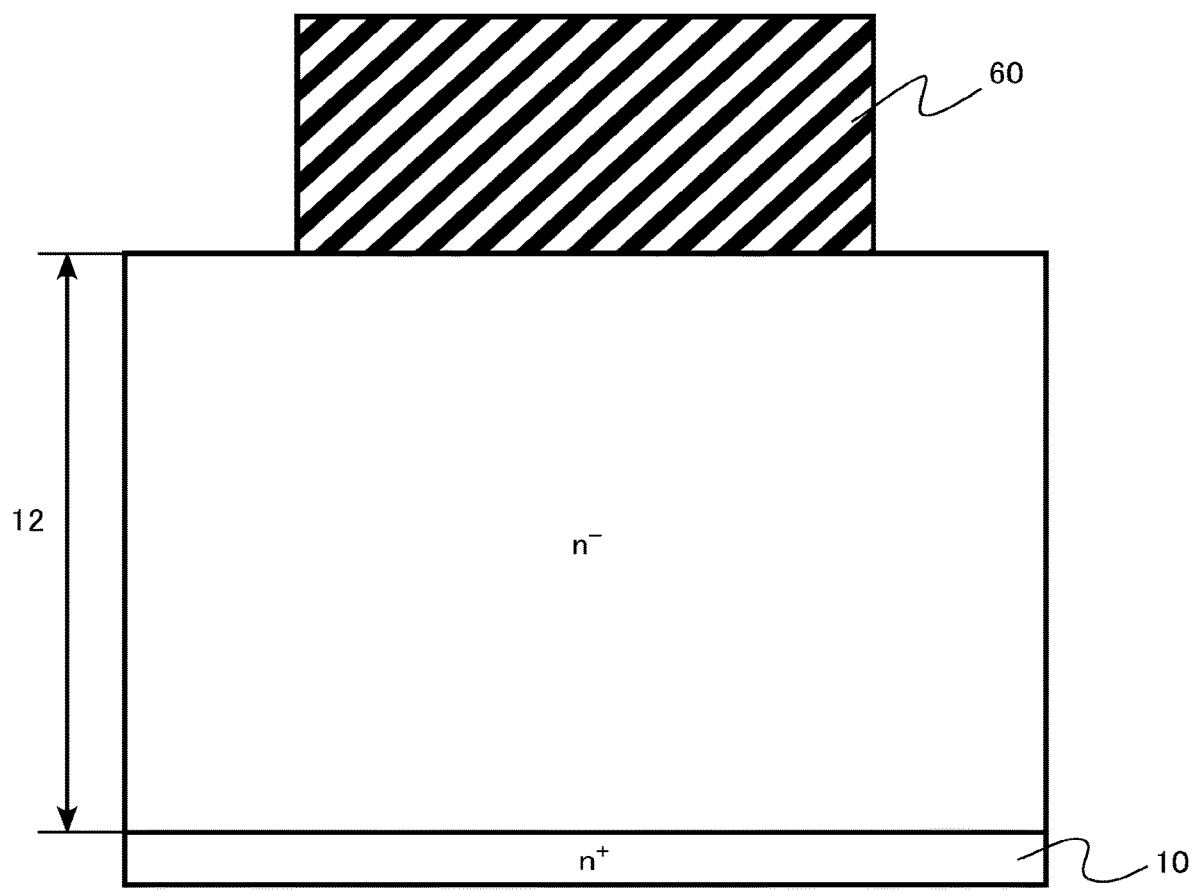
FIG. 4 is a schematic sectional view of a semiconductor device in manufacturing according to the first embodiment.

Next, a photoresist 60 is formed in a predetermined region by a known photolithography method (FIG. 4).

Next, a photoresist 60 heat-shrinks by heat treatment. A side face of the photoresist 60 is tapered by heat shrinkage.

Figure 5:
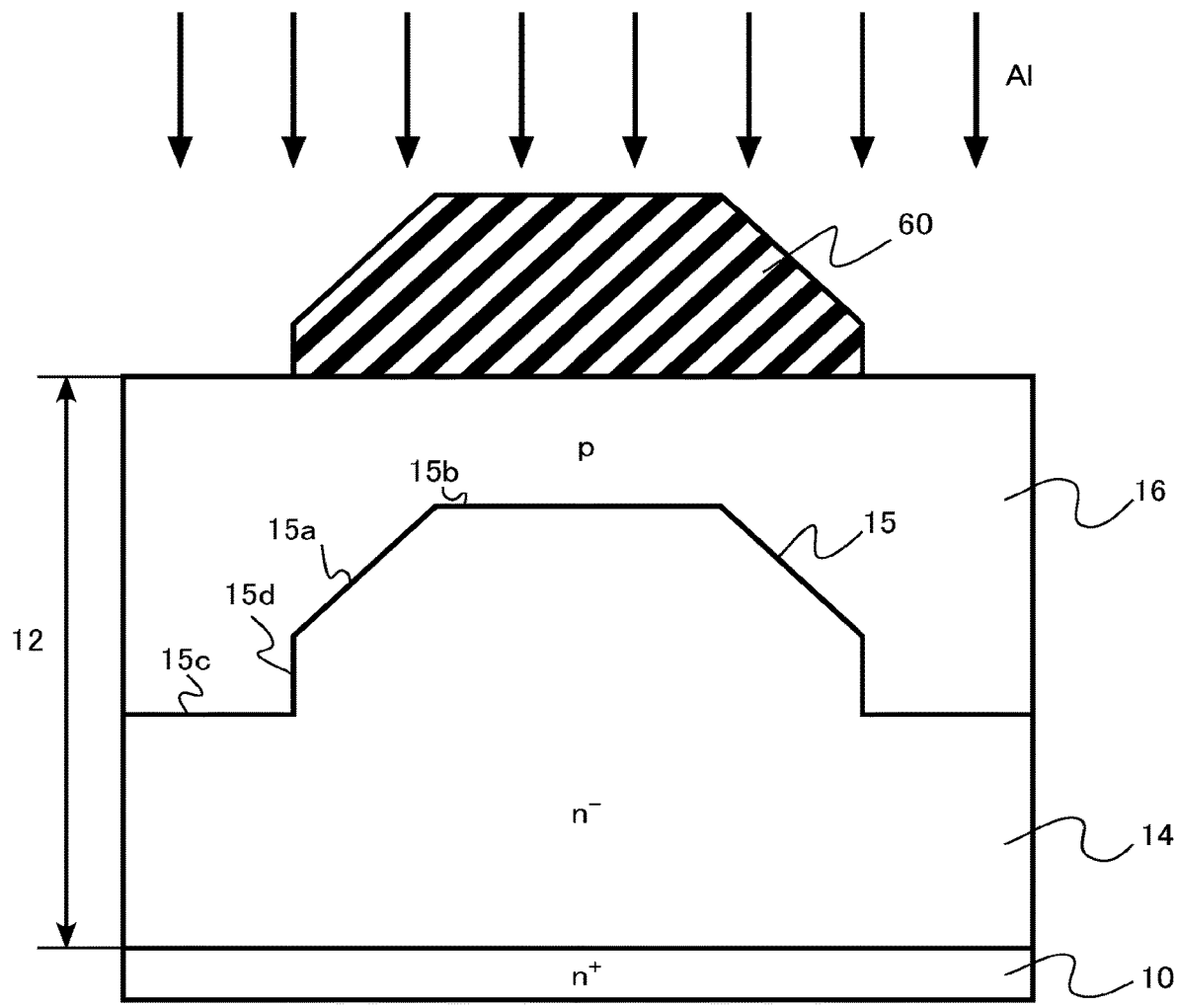
FIG. 5 is a schematic sectional view of a semiconductor device in manufacturing according to the first embodiment.

Then, a p-type impurity is ion-implanted into the SiC layer 12 by using the photoresist 60 as a mask (FIG. 5). An accelerating voltage of the p-type impurity is set such that the p-type impurity passes through the photoresist 60 and reaches the SiC layer 12.

The p-well region 16 is formed by which a p-type impurity is ion-implanted. The drift region 14 is provided between the p-well region 16 and the SiC substrate 10. The p-type impurity is, for example, aluminum (Al).

A shape of the photoresist 60 is reflected to a shape of the boundary 15 between the p-well region 16 and the drift region 14. The boundary 15 is formed which includes the first region 15a, the second region 15b, the third region 15c, and the fourth region 15d.

Figure 6:
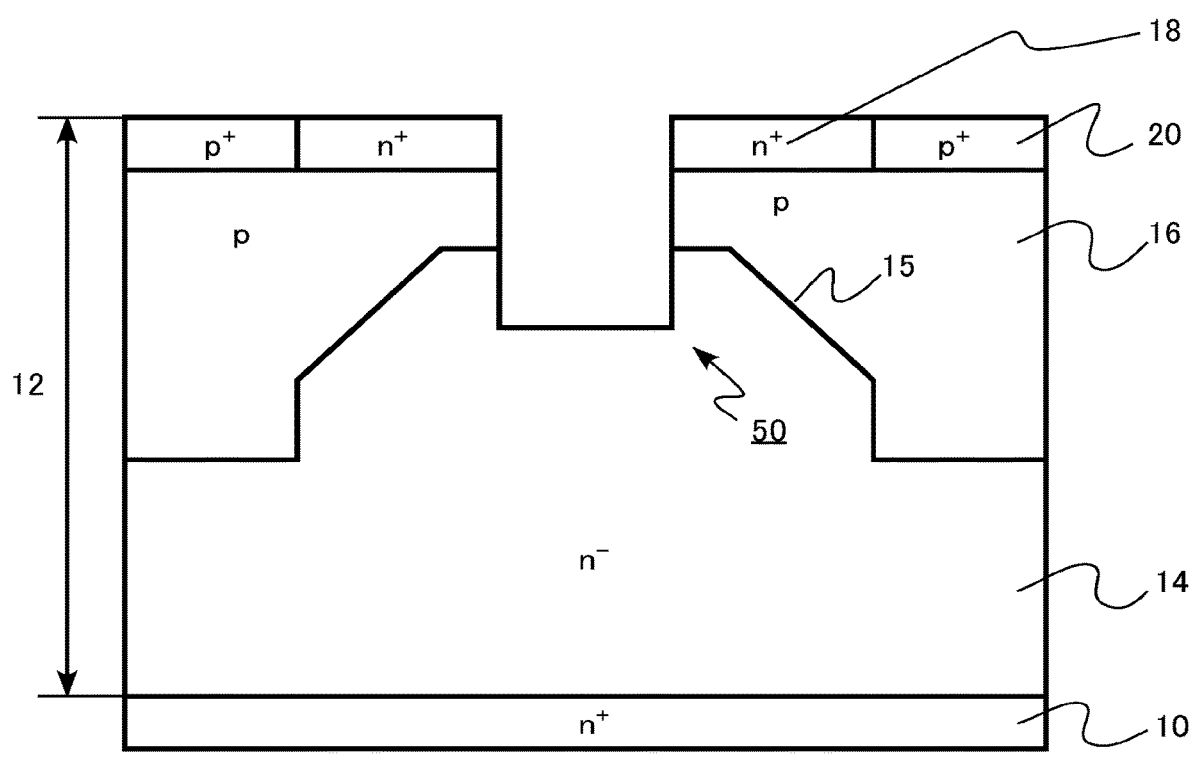
FIG. 6 is a schematic sectional view of a semiconductor device in manufacturing according to the first embodiment.

Next, the trench 50 is formed in the SiC layer 12 (FIG. 6). The trench 50 is formed by a known photolithography method and a known dry etching method.

Figure 7:
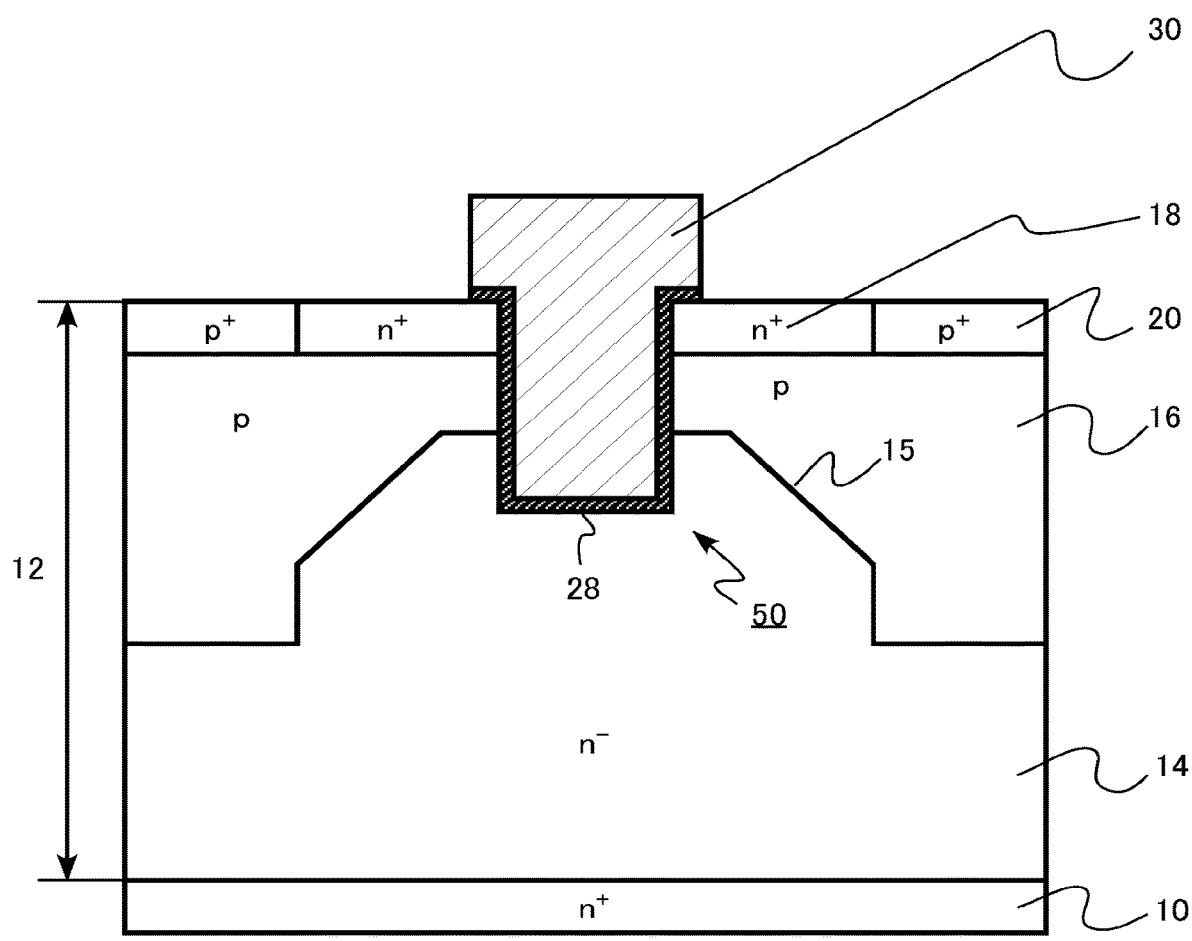
FIG. 7 is a schematic sectional view of a semiconductor device in manufacturing according to the first embodiment.

Next, the gate insulating film 28 is formed on a side face and a bottom face of the trench 50. The gate insulating film 28 is, for example, formed by thermally oxidizing the side face and the bottom face of the trench 50. The gate insulating film 28 can be formed by an LPCVD method. Next, the gate electrode 30 is formed on the gate insulating film 28 by a known method (FIG. 7). The gate electrode 30 is, for example, doped polysilicon formed by the LPCVD method.

Then, an interlayer insulating film 32, a source electrode 34, and a drain electrode 36 are formed by a known process, and the MISFET 100 according to the present embodiment illustrated in FIG. 1 is manufactured.

Functions and effects of a semiconductor device according to the present embodiment will be described below.

A trench-gate type MISFET has a problem that a breakdown voltage of a gate insulating film is decreased by electric field concentration at a bottom of the trench when the MISFET is in an off-state. Especially, by electric field concentration at a bottom corner of the trench, a breakdown voltage of the gate insulating film is decreased, and a breakdown voltage of the MISFET is decreased.

Figure 8:
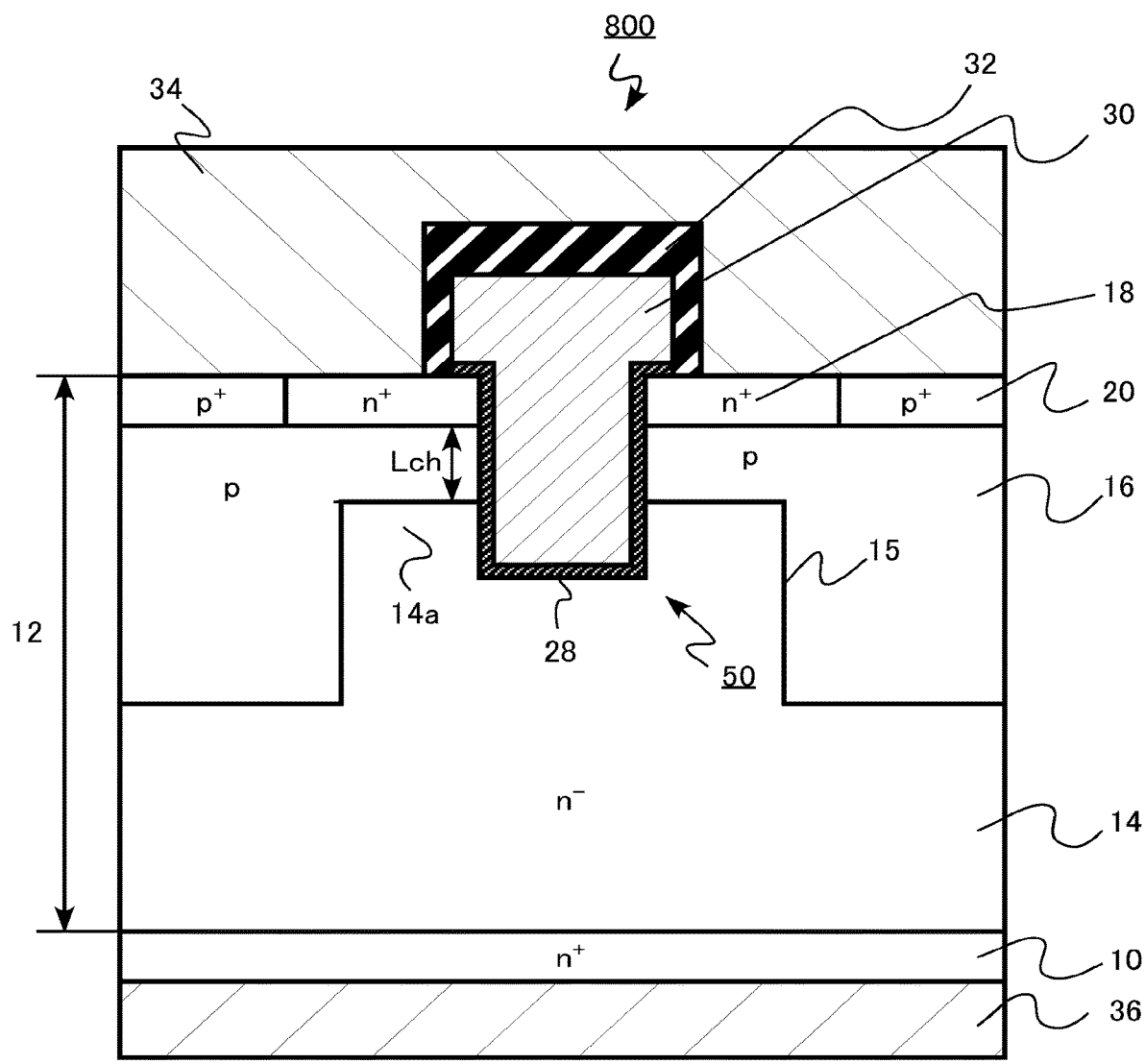
FIG. 8 is a schematic sectional view of an example of a semiconductor device according to a comparative embodiment.

FIG. 8 is a schematic sectional view illustrating an example of a configuration of a MISFET according to a comparative embodiment. In the comparative embodiment, the depth of a part of the p-well region 16 is increased to relax the electric field concentration at a bottom of the trench. When a MISFET 800 is in an off-state, a depletion layer extends from the deep p-well region 16 to the trench 50 side, and an electric field is relaxed at a bottom corner of the trench. Therefore, a breakdown voltage of the gate insulating film is improved.

On the other hand, when the MISFET 800 is an on-state, because the deep p-well region 16 exists, a resistance of the drift region 14 between the p-well region 16 and a side face of the trench 50 is increased. Therefore, there is a new problem that an on-resistance of the MISFET 800 is increased.

Figure 9:
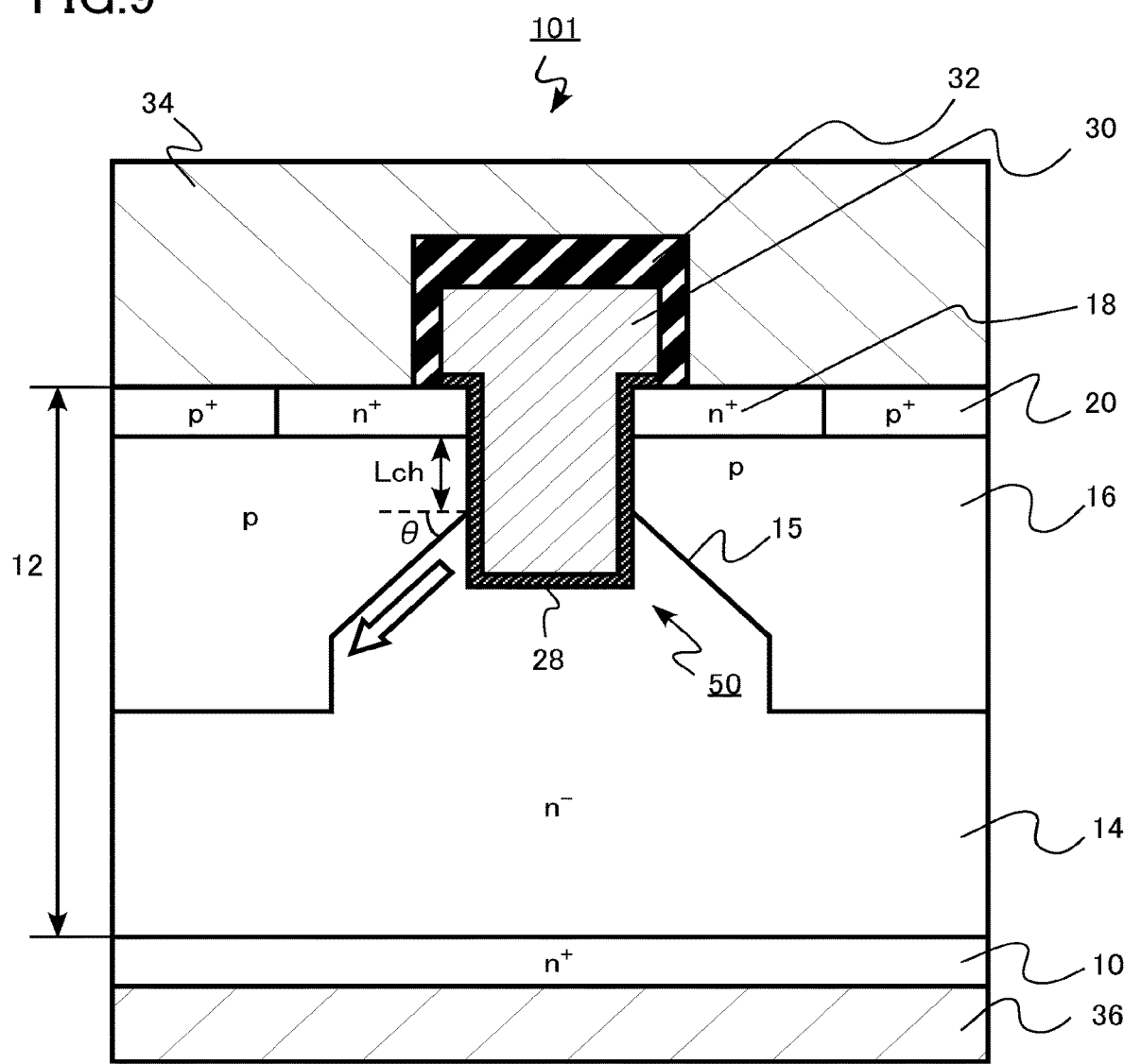
FIG. 9 is a schematic sectional view of another example of the semiconductor device according to the first embodiment.

FIG. 9 is a schematic sectional view illustrating another example of a configuration of a MISFET according to the present embodiment. FIG. 9 illustrates a configuration similar to the configuration of the MISFET 101 illustrated in FIG. 2.

A relation between the maximum electric field and an on-resistance in a gate insulating film is calculated by simulation by changing a channel length (Lch in FIG. 9) of the MISFET 101. The channel length is set to 0.1 μm, 0.2 μm, and 0.3 μm. When the channel length is changed, the boundary 15 is moved up and down in a state in which a shape of the boundary 15 is maintained. Further, the first inclination angle θ is fixed to 45°.

Similarly, also in the MISFET 800 according to the comparative embodiment, a relation between a maximum electric field and an on-resistance in the gate insulating film is calculated by simulation by changing a channel length (Lch in FIG. 8). The channel length is set to 0.1 μm, 0.2 μm, 0.3 μm, 0.4 μm, 0.5 μm, and 0.6 μm.

Figure 10:
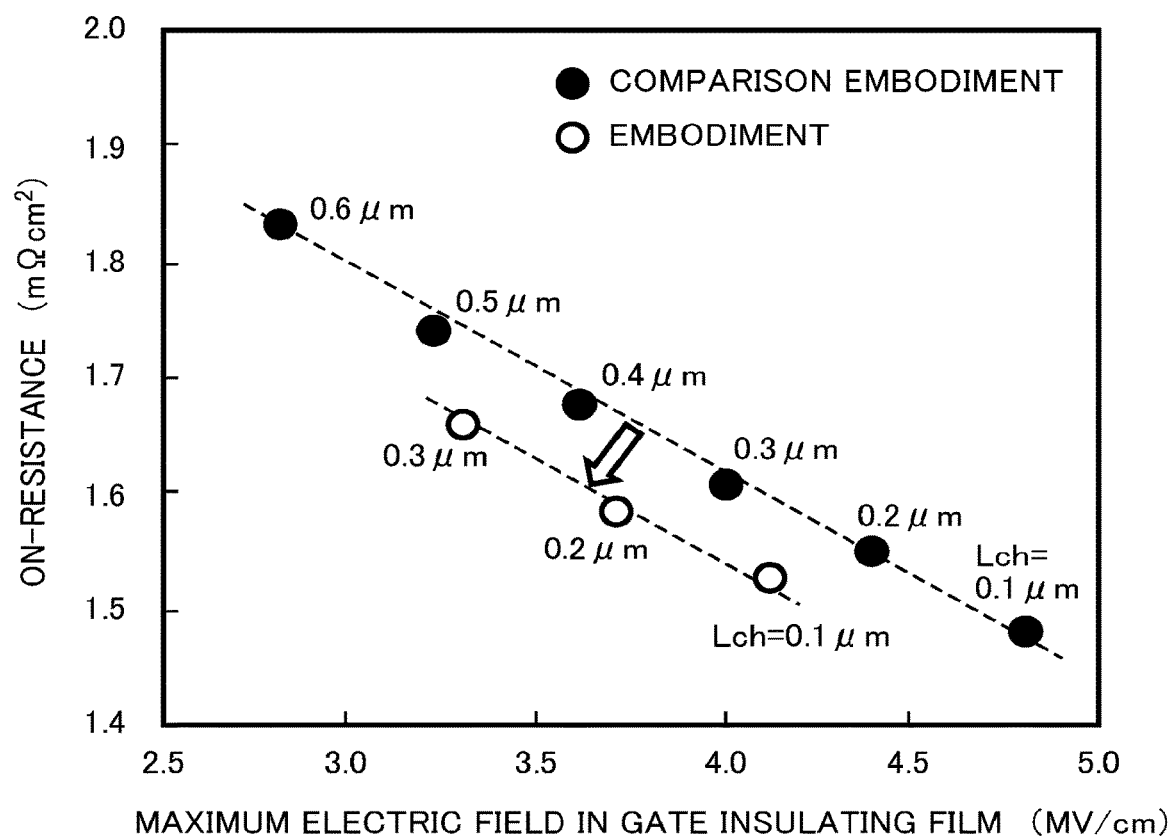
FIG. 10 is an explanatory diagram of functions and effects of the semiconductor device according to the first embodiment.

FIG. 10 is an explanatory diagram of functions and effects of a semiconductor device according to the present embodiment. FIG. 10 is a diagram illustrating a relation between a maximum electric field and an on-resistance in the gate insulating film 28. As illustrated in FIG. 10, the maximum electric field and the on-resistance in the gate insulating film 28 are in a trade-off relation both in the embodiment and the comparative embodiment.

When the channel lengths (Lch) of the MISFETs 101 and 800 are shortened, an electric field relaxation effect by a depletion layer extending from the p-well region 16 is decreased at a bottom corner of the trench 50, and a maximum electric field in the gate insulating film 28 is increased. Therefore, a breakdown voltage of the gate insulating film 28 is decreased.

Further, when channel lengths (Lch) of the MISFETs 101 and 800 are shortened, a channel resistance is decreased, and an on-resistance is increased.

As illustrated in FIG. 10, in the embodiment in comparison with the comparative embodiment, a trade-off relation between a maximum electric field and an on-resistance in the gate insulating film 28 is improved. This may be because, in the case of the embodiment, (1) as indicated by a white arrow in FIG. 9, an on-current flows along the inclined first region 15a, and therefore an on-resistance is decreased in comparison with the comparative embodiment, and (2) a depletion layer extends toward the trench 50 from the inclined first region 15a, and therefore, in comparison with the comparative embodiment, an electric field relaxation effect is increased at a bottom corner of the trench 50. Therefore, in the case of comparing at a same on-resistance, the maximum electric field in the gate insulating film 28 is relaxed, and a breakdown voltage of the gate insulating film 28 is improved in the MISFET 101 according to the embodiment.

Figure 11:
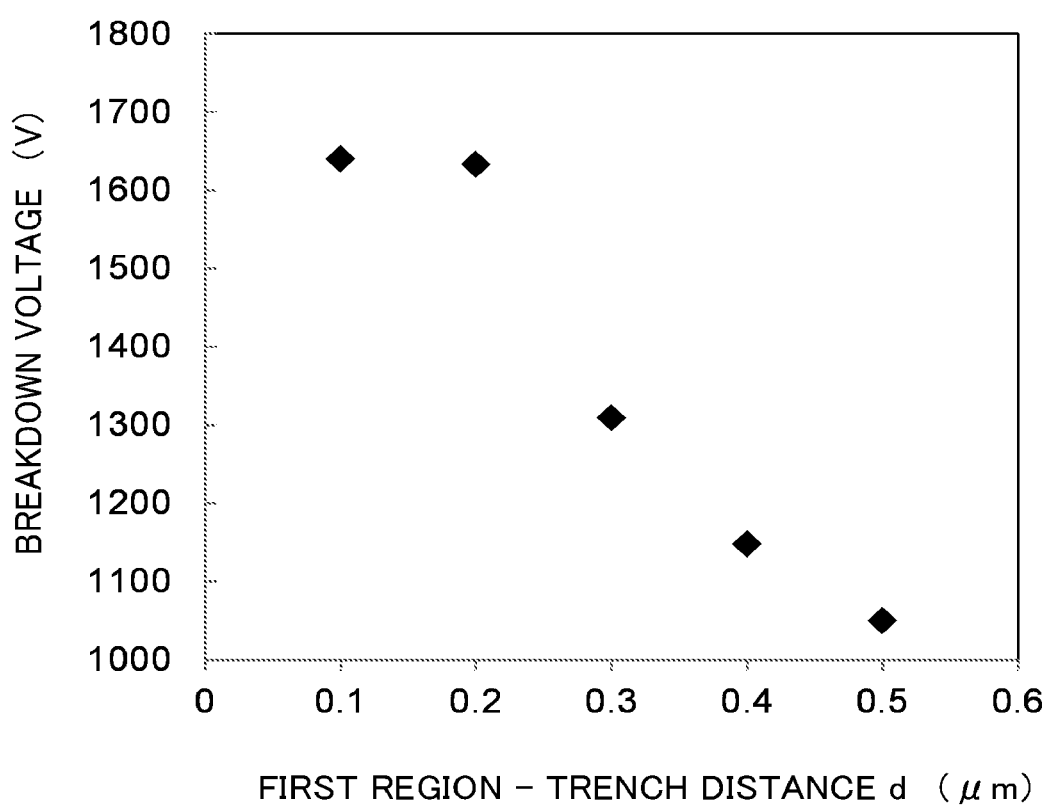
FIG. 11 is an explanatory diagram of functions and effects of the semiconductor device according to the first embodiment.

FIG. 11 is an explanatory diagram of functions and effects of a semiconductor device according to the present embodiment. FIG. 11 indicates a result of a relation between a distance (d in FIG. 1) between the first region 15a and a side face of the trench 50 and a breakdown voltage of the MISFET 100, which is determined by a simulation, in a structure of the MISFET 100 illustrated in FIG. 1.

A breakdown voltage indicated by a vertical axis is a breakdown voltage between the source electrode 34 and the drain electrode 36. In the simulation, a channel length (Lch in FIG. 1) is fixed to 0.1 μm.

As illustrated in FIG. 11, when a distance between the first region 15a and a side face of the trench 50 exceeds 0.3 μm, a breakdown voltage is drastically reduced. When the distance is 0.2 μm or less, a high breakdown voltage is stably maintained.

The MISFET according to the embodiment includes the inclined first region 15a. Since the first region 15a is inclined, extension of a depletion layer toward a channel region from the drift region 14 is suppressed when the MISFET is in an off-state. Therefore, when a channel length is shortened, punch-through of the MISFET is suppressed, and a breakdown voltage of the MISFET is improved.

When a distance between the first region 15a and a side face of the trench 50 is excessively increased, an effect to suppress the extension of a depletion layer toward a channel region from the drift region 14 is reduced. Therefore, a breakdown voltage of the MISFET is reduced.

As a result indicated in FIG. 11, a shortest distance between the first region 15a and a side face of the trench 50 (d in FIG. 1) is preferably 0 μm or more and 0.3 μm or less to improve a breakdown voltage of the MISFET. The distance between the first region 15a and a side face of the trench 50 (d in FIG. 1) is more preferably 0.2 μm or less and further preferably 0.1 μm or less.

Figure 12:
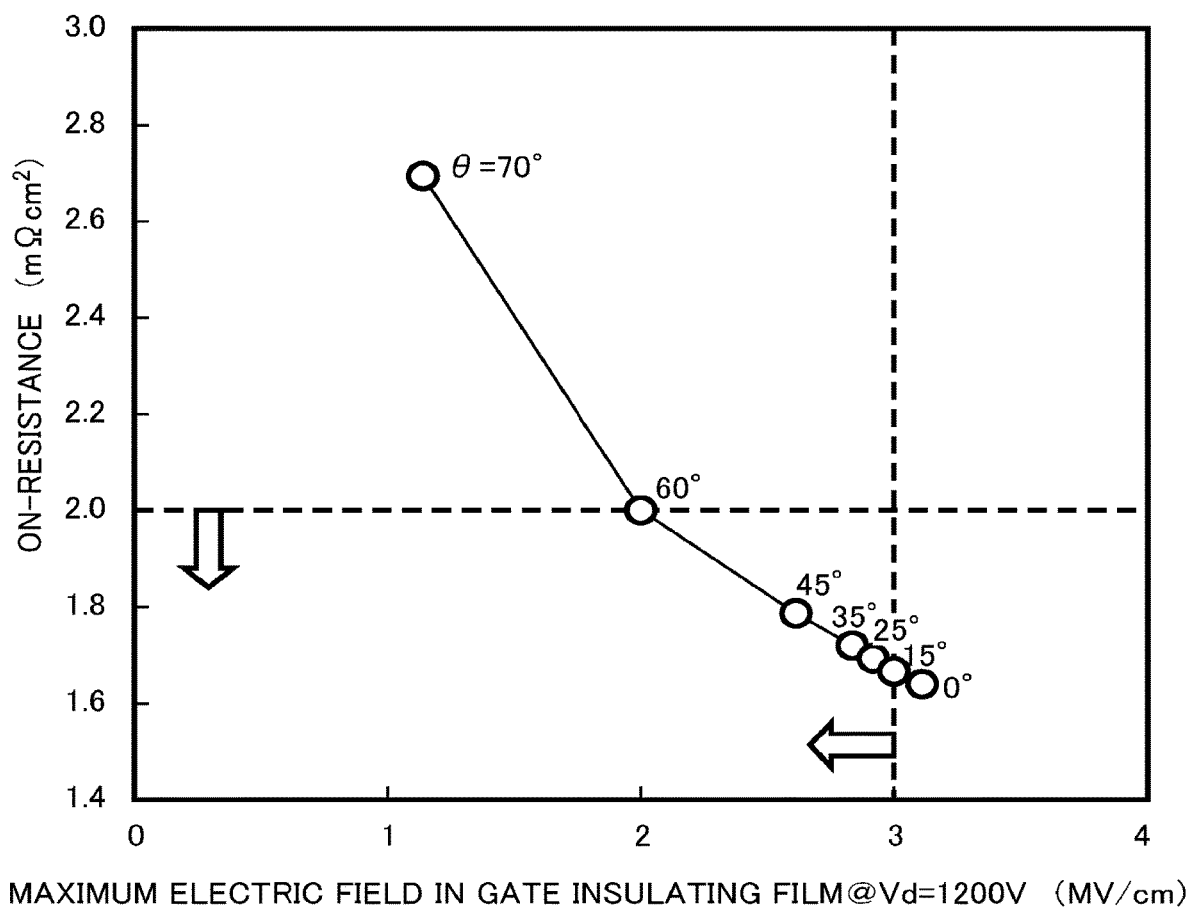
FIG. 12 is an explanatory diagram of functions and effects of the semiconductor device according to the first embodiment.

FIG. 12 is a diagram illustrating functions and effects of a semiconductor device according to the present embodiment. A relation between a maximum electric field and an on-resistance in a gate insulating film is calculated by simulation by changing the first inclination angle θ of the first region 15a in the MISFET 101 illustrated in FIG. 9. A voltage applied between the source electrode 34 and the drain electrode 36 is set to 1200 V.

To reduce an on-resistance in comparison with a planer-type MISFET, the on-resistance is preferably 2 mΩ cm$^2$ or less. Further, in the case where the gate insulating film 28 is a silicon oxide film, a maximum electric field is preferably 3 MV/cm or less in terms of securing a breakdown voltage of the gate insulating film 28. Therefore, the first inclination angle θ is preferably 15° or more and 60° or less.

In terms of improving a breakdown voltage of the gate insulating film 28, film thickness of the gate insulating film 28 on a bottom face of the trench 50 is preferably thicker than a film thickness of the gate insulating film 28 on a side face of the trench 50.

According to the MISFET of the embodiment, a trade-off relation between a maximum electric field and an on-resistance in the gate insulating film 28 is improved. Therefore, a breakdown voltage of the gate insulating film 28 is increased. Further, punch-through in a channel region is suppressed, and a breakdown voltage between source drains is increased. Accordingly, a MISFET having a high breakdown voltage can be realized.

Second Embodiment

A semiconductor device according to a second embodiment is similar to the semiconductor device according to the first embodiment other than that a boundary between a second SIC region and a third SiC region does not include a fourth region. Therefore, description of contents already described in the first embodiment will be omitted.

Figure 13:
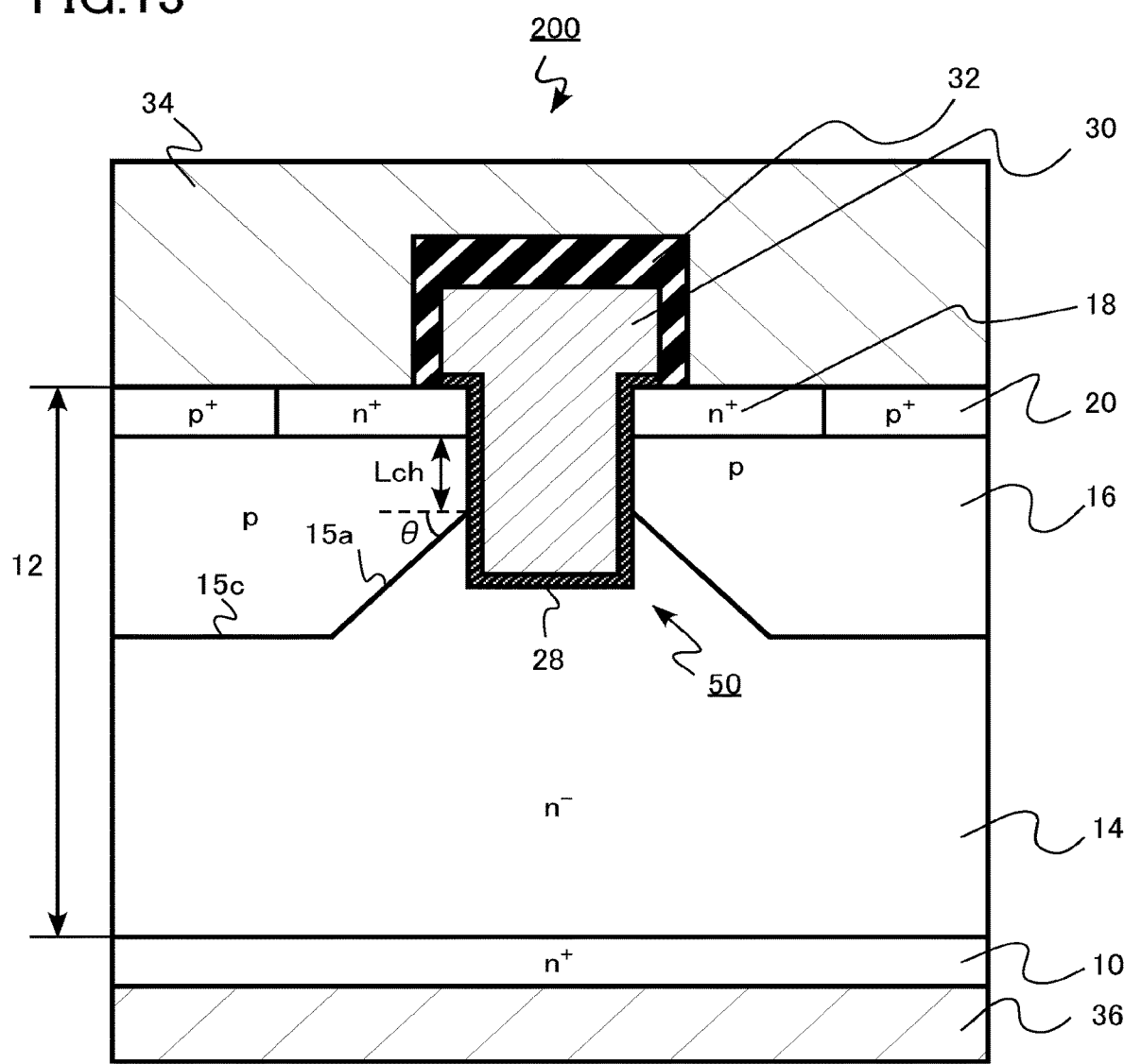
FIG. 13 is a schematic sectional view of a semiconductor device according to a second embodiment.

FIG. 13 is a schematic sectional view illustrating a configuration of a MISFET which is a semiconductor device according to the present embodiment. A MISFET 200 is a trench-gate type MOSFET.

A boundary 15 between a p-well region 16 and a drift region 14 comes into contact with a side face of a trench 50. The boundary 15 between the p-well region 16 and the drift region 14 includes a first region 15a and a third region 15c.

The first region 15a comes into contact with a side face of the trench 50. Further, the boundary 15 between the p-well region 16 and the drift region 14 does not include a bending portion with an angle of 90° or less.

Figure 14:
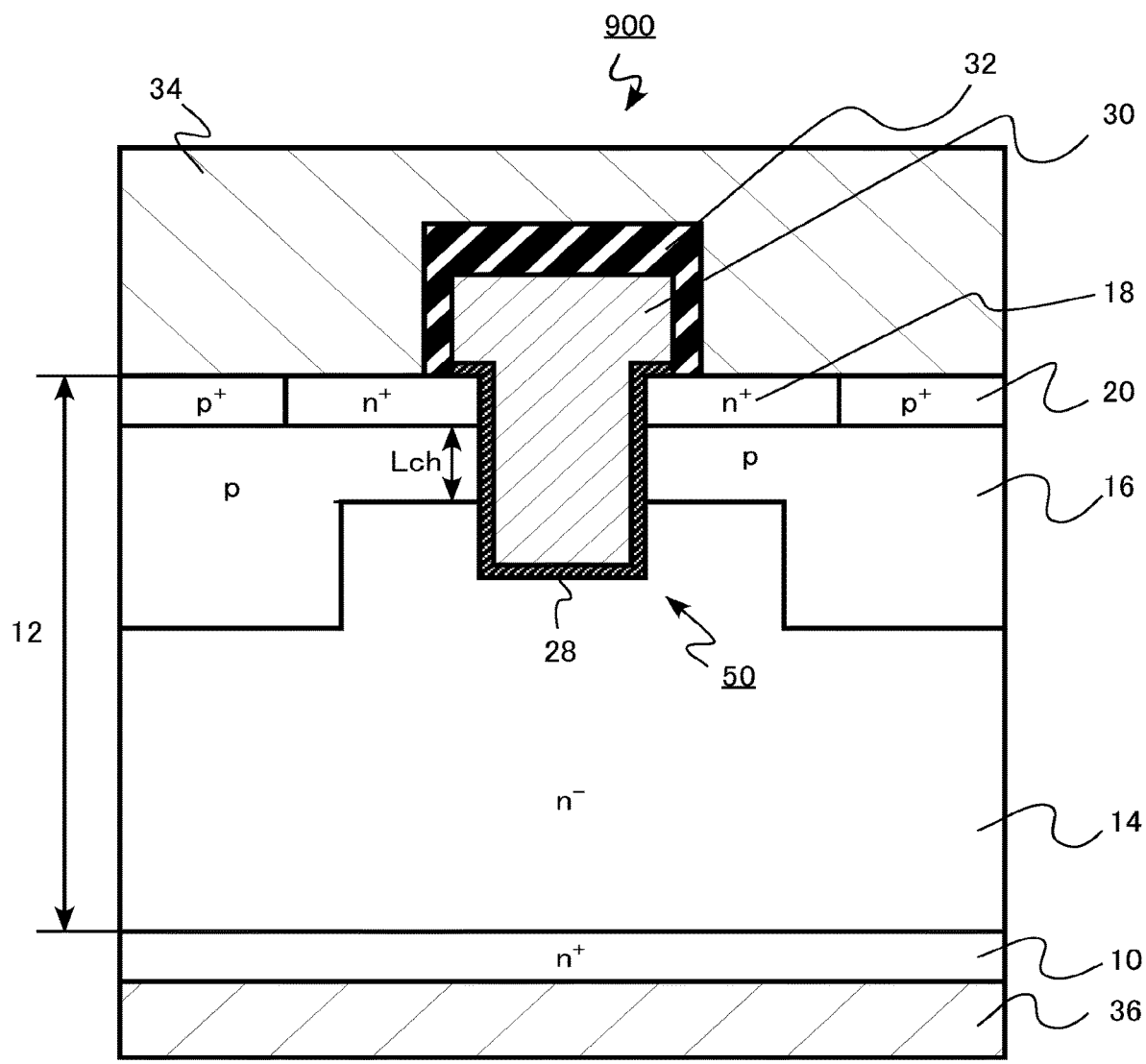
FIG. 14 is a schematic sectional view of a semiconductor device according to a comparative embodiment.

FIG. 14 is a schematic sectional view illustrating an example of a configuration of a MISFET according to a comparative embodiment. In the comparative embodiment, the depth of a part of the p-well region 16 is increased to relax electric field concentration at a bottom of the trench 50. When a MISFET 900 is in an off-state, a depletion layer extends from the deep p-well region 16 to the trench 50 side, and an electric field is relaxed at a bottom corner of the trench 50. Therefore, a breakdown voltage of a gate insulating film 28 is improved.

A relation between a maximum electric field and an on-resistance in the gate insulating film 28 is calculated by simulation by changing a channel length (Lch in FIG. 13) of the MISFET 200. The channel length is set to 0.1 μm, 0.2 μm, 0.3 μm, 0.4 μm, 0.5 μm, and 0.6 μm. The first inclination angle θ is fixed to 45°.

Similarly, also in the MISFET 900 according to the comparative embodiment, the relation between the maximum electric field and an on-resistance in the gate insulating film is calculated by simulation by changing a channel length (Lch in FIG. 14). The channel length is set to 0.2 μm, 0.3 μm, 0.4 μm, 0.5 μm, and 0.6 μm.

Figure 15:
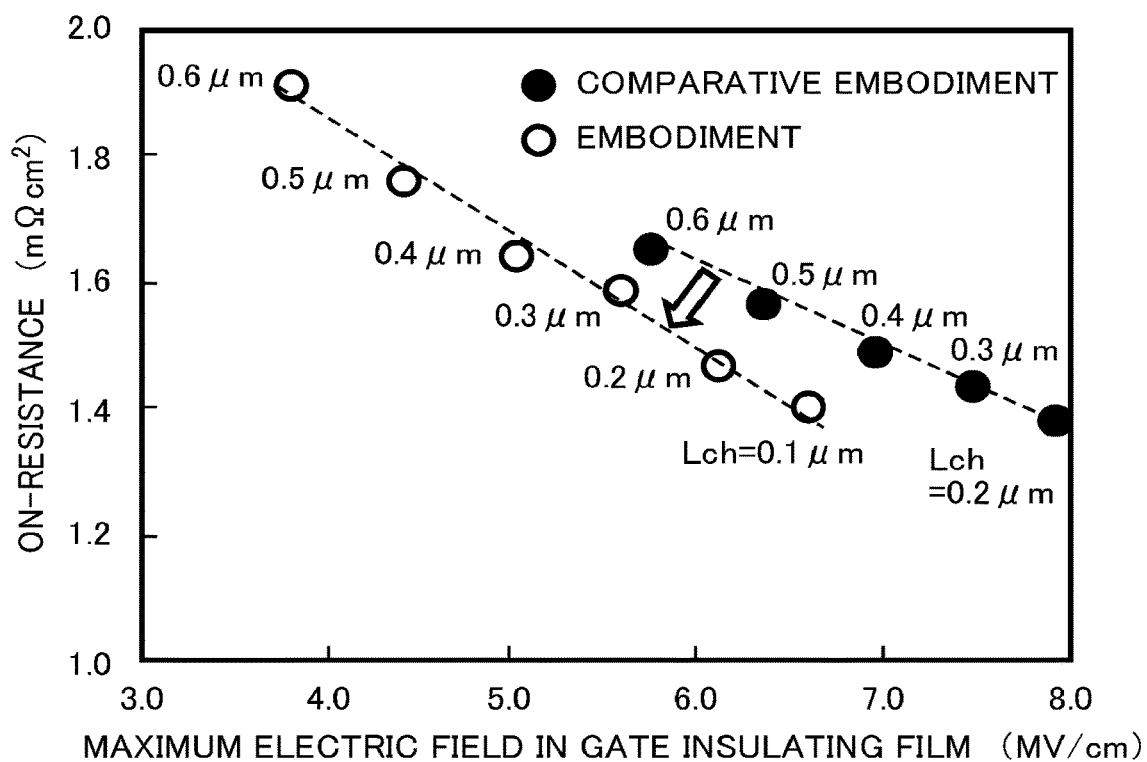
FIG. 15 is an explanatory diagram of functions and effects of the semiconductor device according to the second embodiment.

FIG. 15 is an explanatory diagram of functions and effects of a semiconductor device according to the present embodiment. FIG. 15 is a view illustrating a relation between a maximum electric field and an on-resistance in a gate insulating film.

As illustrated in FIG. 15, in the embodiment in comparison with the comparative embodiment, a trade-off relation between a maximum electric field and an on-resistance in the gate insulating film 28 is improved. Therefore, in the case of comparing at a same on-resistance, the maximum electric field in the gate insulating film 28 is relaxed and a breakdown voltage of the gate insulating film 28 is improved in the MISFET 200 according to the embodiment.

According to the MISFET of the present embodiment, as with the MISFET of the first embodiment, a breakdown voltage of the gate insulating film 28 and a breakdown voltage between source drains are increased. Further, the boundary 15 does not include a bending portion with an angle of 90° or less. Therefore, electric field concentration at the boundary 15 is suppressed when the MISFET is in an off-state, and a breakdown at the boundary 15 is suppressed. Accordingly, a MISFET having a further high breakdown voltage can be realized.

Third Embodiment

A semiconductor device according to a third embodiment is similar to the semiconductor device according to the first embodiment other than that a second conductivity type fifth SiC region is further included. The fifth SiC region is provided between a bottom face of a trench and a third SiC region in a SiC layer and contacted with the bottom face. Therefore, description of contents already described in the first embodiment will be omitted.

Figure 16:
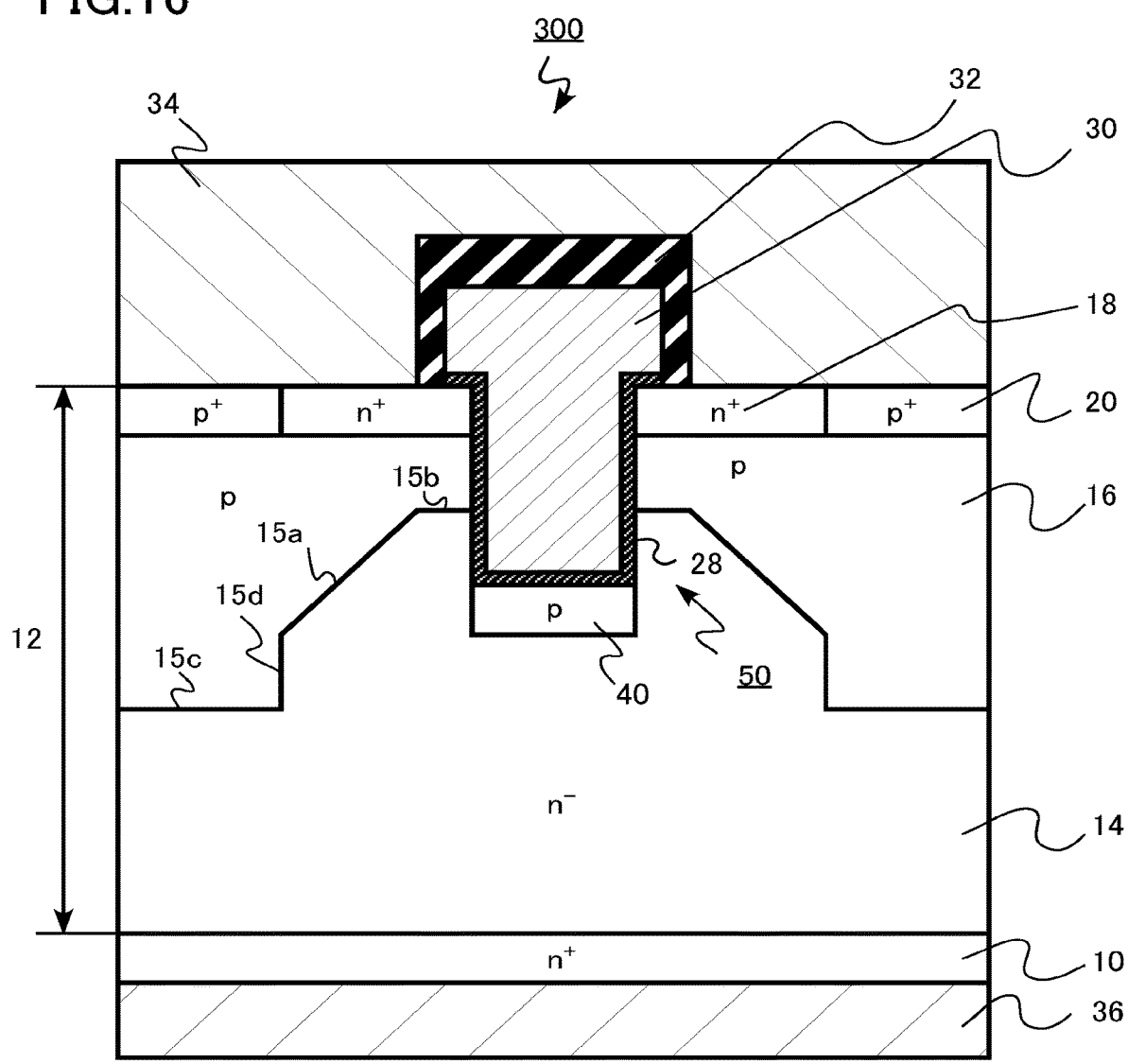
FIG. 16 is a schematic sectional view of a semiconductor device according to a third embodiment.

FIG. 16 is a schematic sectional view illustrating a configuration of a MISFET which is a semiconductor device according to the present embodiment. A MISFET 300 is a trench-gate type MOSFET.

The MISFET 300 includes a p-type electric field relaxation region 40 in a SiC layer 12. The electric field relaxation region 40 is provided between a bottom face of a trench 50 and a drift region 14. The electric field relaxation region 40 has a function to relax electric field concentration at a bottom of the trench 50 when the MISFET 300 is in an off-state.

The electric field relaxation region 40, for example, includes Al (aluminum) as a p-type impurity. A concentration of the p-type impurity in the electric field relaxation region 40 is, for example, $1 \times 10^{17}$ cm$^{-3}$ or more and $1 \times 10^{19}$ cm$^{-3}$ or less.

According to the MISFET of the present embodiment, as with the MISFET of the first embodiment, a breakdown voltage of a gate insulating film 28 and a breakdown voltage between source drains are increased. Further, a breakdown voltage of the gate insulating film 28 at a bottom of the trench 50 is further improved by including the electric field relaxation region 40.

Fourth Embodiment

A semiconductor device according to a fourth embodiment is similar to the semiconductor device according to the first embodiment other than that the SiC layer includes a second trench at the side of front face of the SiC layer, the first SiC region is provided between the first trench and the second trench, and at least a part of the first electrode is disposed in the second trench. Therefore, description of contents already described in the first embodiment will be omitted.

Figure 17:
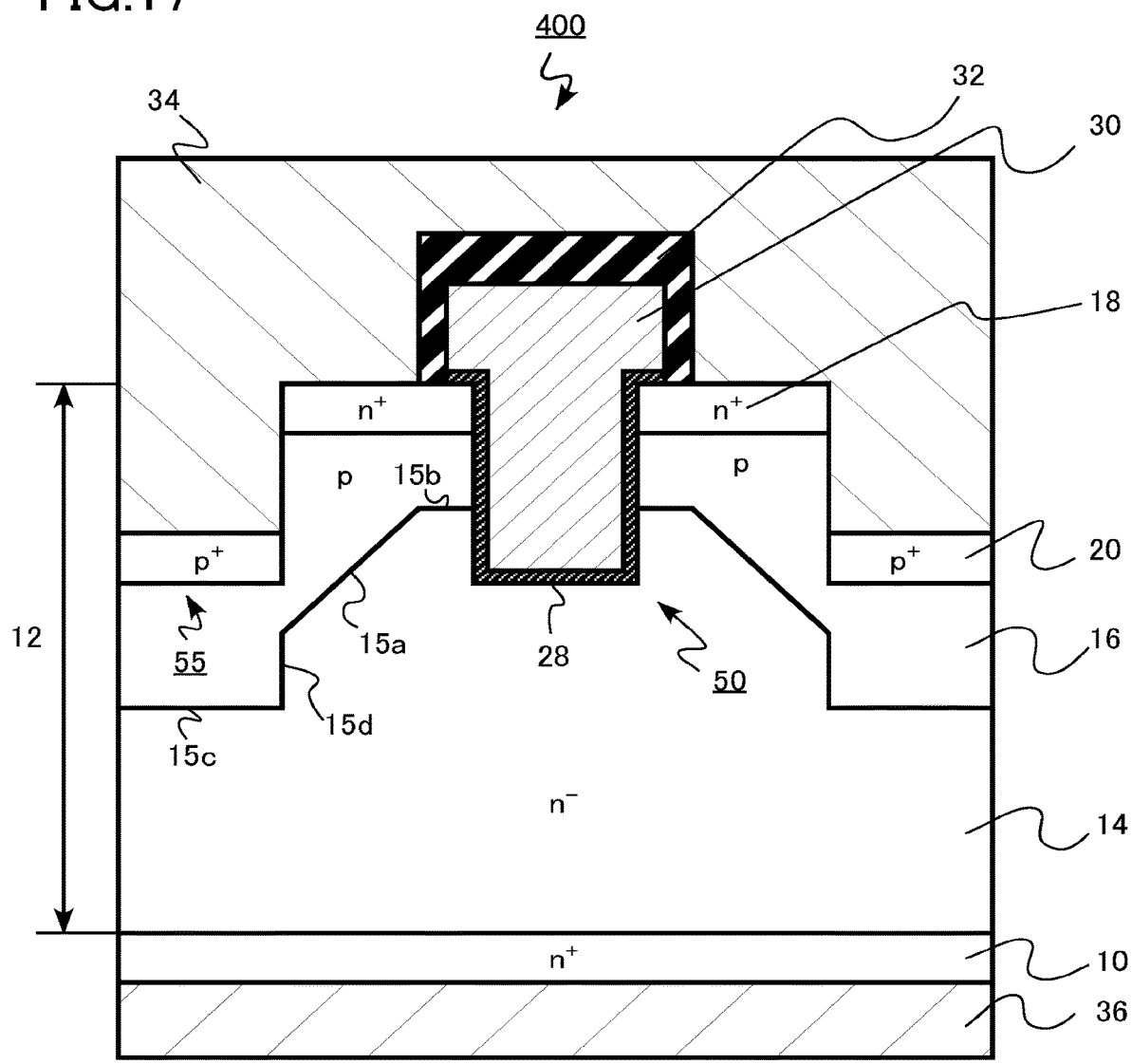
FIG. 17 is a schematic sectional view of a semiconductor device according to a fourth embodiment.

FIG. 17 is a schematic sectional view illustrating a configuration of a MISFET which is a semiconductor device according to the present embodiment. A MISFET 400 is a trench-gate type MOSFET.

In the MISFET 400, the source electrode 34 is provided in a trench (second trench) 55 provided in a SiC layer 12. A p$^+$-type p-well contact region 20 is provided at a bottom or on a side face of the trench 55.

According to the MISFET of the present embodiment, as with the MISFET of the first embodiment, a breakdown voltage of the gate insulating film 28 and a breakdown voltage between source drains are increased. Further, a contact structure can be scaled-down by providing the source electrode 34 in the trench 55.

Further, by providing the source electrode 34 in the trench 55, a deep p-well region 16 can be easily formed. Specifically, after the trench 55 is formed in the SiC layer 12, the deep p-well region 16 can be easily formed by forming the p-well region 16 by ion implantation into a bottom of the trench 55.

Fifth Embodiment

A semiconductor device according to a fifth embodiment is similar to the semiconductor device according to the first embodiment other than that an insulated gate bipolar transistor (IGBT) is used instead of a MISFET. Therefore, description of contents already described in the first embodiment will be omitted.

Figure 18:
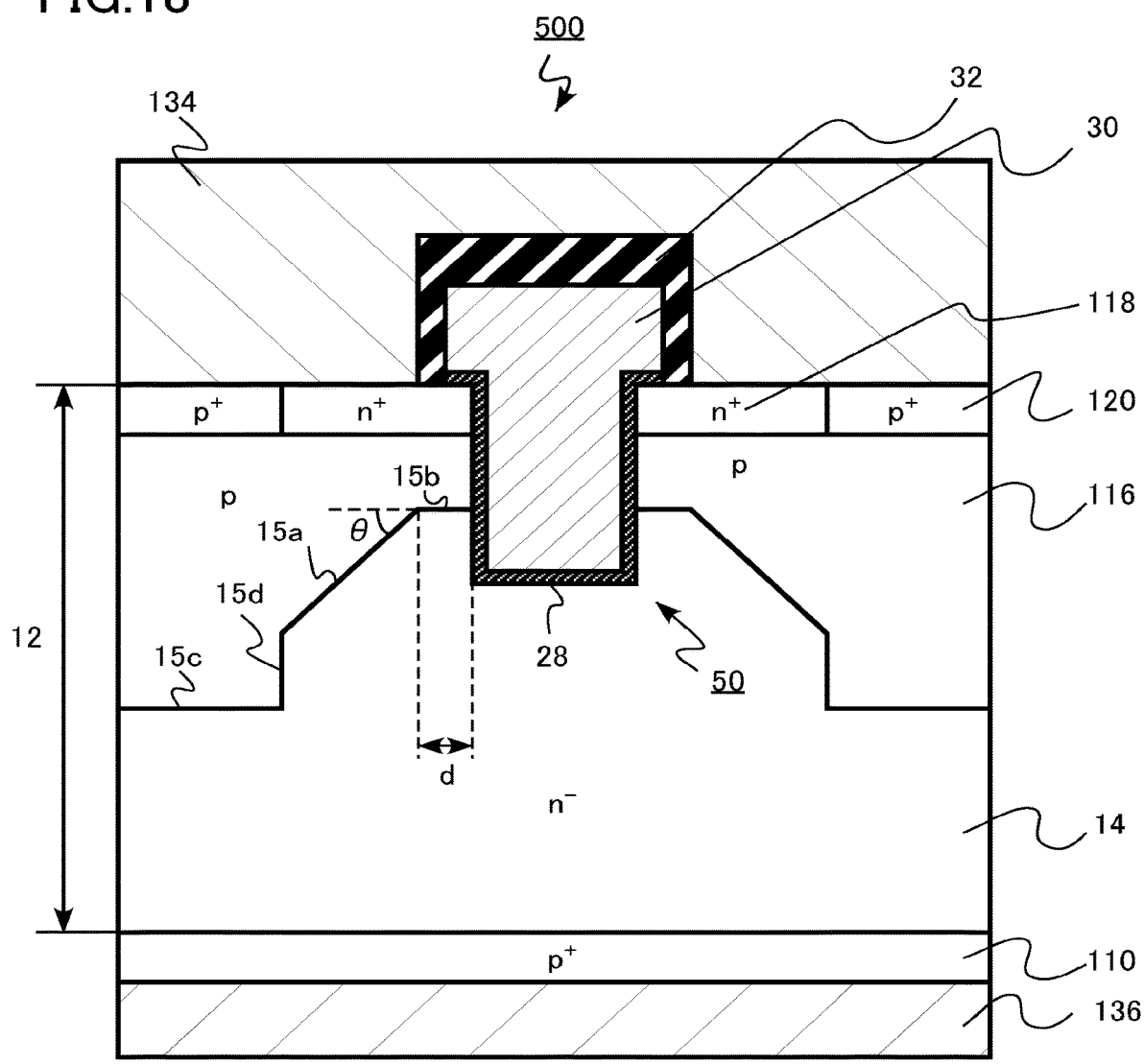
FIG. 18 is a schematic sectional view of a semiconductor device according to a fifth embodiment.

FIG. 18 is a schematic sectional view illustrating a configuration of an IGBT which is a semiconductor device according to the present embodiment. An IGBT 500 is a trench-gate type IGBT in which a gate insulating film and a gate electrode are provided in a trench.

The IGBT 500 includes a SiC substrate 110, a SiC layer 12, a drift region (third SiC region) 14, an boundary 15, a first region 15a, a second region 15b, a third region 15c, a fourth region 15d, a p-base region (second SiC region) 116, an emitter region (first SiC region) 118, a p-base contact region (fourth SiC region) 120, a gate insulating film (insulating film) 28, a gate electrode 30, an interlayer insulating film 32, an emitter electrode (electrode) 134, a collector electrode 136, and a trench 50.

The IGBT 500 includes a p$^+$-type SiC substrate 110. The SiC substrate 110 is, for example, a SiC substrate of 4H—SiC including Al (aluminum) as a p-type impurity. An impurity concentration of a p-type impurity is, for example, $1\times10^{18}$ cm$^{-3}$ or more and $1\times10^{20}$ cm$^{-3}$ or less. The SiC substrate 110 functions as a collector region of the IGBT 500.

A front face of the SiC substrate 110 is, for example, a face inclined at 0° or more and 10° or less with respect to a (0001) face (silicon face). A back face of the SiC substrate 110 is, for example, a face inclined at 0° or more and 10° or less with respect to a (000-1) face (carbon face).

The SiC layer 12 is provided on the SiC substrate 110. The SiC layer 12, for example, includes N (nitrogen) as an n-type impurity. A concentration of the n-type impurity in the SiC layer 12 is, for example, $1\times10^{14}$ cm$^{-3}$ or more and $1\times10^{17}$ cm$^{-3}$ or less. The SiC layer 12 is, for example, an epitaxial layer of SiC formed on the SiC substrate 110 by epitaxial growing.

A front face of the SiC layer 12 is a face inclined at 0° or more and 10° or less with respect to a silicon face. A film thickness of the SiC layer 12 is, for example, 5 μm or more and 150 μm or less.

The drift region (third SiC region) 14, the p-base region (second SiC region) 116, the emitter region (first SiC region) 118, the p-base contact region (fourth SiC region) 120 are provided in the SiC layer 12.

The n$^-$-type drift region 14 is provided between the p-base region 116 and the SiC substrate 110. The drift region 14, for example, includes N (nitrogen) as an n-type impurity. A concentration of the n-type impurity in the drift region 14 is, for example, $1\times10^{14}$ cm$^{-3}$ or more and $1\times10^{17}$ cm$^{-3}$ or less.

The p-type p-base region 116 is provided between the emitter region 118 and the SiC substrate 110. The p-base region 116 functions as a channel region of the IGBT 500.

The p-base region 116, for example, includes Al (aluminum) as a p-type impurity. A concentration of the p-type impurity in the p-base region 116 is, for example, $5\times10^{15}$ cm$^{-3}$ or more and $1\times10^{18}$ cm$^{-3}$ or less. The depth of the p-base region 116 is, for example, 0.6 μm or more and 1.2 μm or less.

The n$^+$-type emitter region 118 is provided in the p-base region 116. A part of the emitter region 118 comes into contact with a front face of the SiC layer 12.

The emitter region 118, for example, includes N (nitrogen) as an n-type impurity. A concentration of the n-type impurity in the emitter region 118 is, for example, $1\times10^{18}$ cm$^{-3}$ or more and $1\times10^{22}$ cm$^{-3}$ or less. The depth of the emitter region 118 is shallower than the depth of the p-base region 116. The depth of the emitter region 118 is, for example, around 0.3 μm.

Further, the p$^+$-type p-base contact region 120 is provided in the p-base region 116. The p-base contact region 120 is provided on a side of the emitter region 118.

The p-base contact region 120, for example, includes Al (aluminum) as a p-type impurity. A concentration of the p-type impurity in the p-base contact region 120 is higher than a concentration of a p-type impurity in the p-base region 116. For example, the concentration is $1\times10^{18}$ cm$^{-3}$ or more and $1\times10^{22}$ cm$^{-3}$ or less. The depth of the p-base contact region 120 is shallower than the depth of the p-base region 116 and, for example, around 0.3 μm.

The trench 50 is provided in the SiC layer 12. A side face of the trench 50 is, for example, an m face or an a face. The depth of the trench 50 is shallower than a maximum depth of the p-base region 116.

A boundary 15 between the p-base region 116 and the drift region 14 comes into contact with the trench 50.

The boundary 15 between the p-base region 116 and the drift region 14 includes a first region 15a, a second region 15b, a third region 15c, and a fourth region 15d.

A distance from a front face of the SiC layer 12 to the first region 15a increases as a distance from the trench 50 increases. The first region 15a includes a first inclination angle (θ in FIG. 1). A shortest distance between the first region 15a and a side face of the trench (d in FIG. 1) is 0 μm or more and 0.3 μm or less.

The second region 15b is substantially parallel to a front face of the SiC layer 12. The second region 15b is provided between the first region 15a and the trench 50. The second region 15b comes into contact with a side face of the trench 50.

The third region 15c is substantially parallel to a front face of the SiC layer 12. The first region 15a is provided between the third region 15c and the trench 50.

The fourth region 15d is substantially perpendicular to a front face of the SiC layer 12. The first region 15a is provided between the fourth region 15d and the trench 50. The fourth region 15d is provided between the third region 15c and the first region 15a.

A shape of the boundary 15 between the p-base region 116 and the drift region 14 can be monitored, for example, by a scanning capacitance microscopy.

The gate insulating film 28 is provided on a side face and a bottom face of the trench 50. At least a part of the gate insulating film 28 comes into contact with the emitter region 118, the p-base region 116, and the drift region 14. The gate insulating film 28 is provided between the SiC layer 12 and the gate electrode 30.

For example, an oxide film is used for the gate insulating film 28. For example, a silicon oxide film, a silicon oxynitride film, or a high-k insulating film can be used for the gate insulating film 28.

The gate electrode 30 is provided on the gate insulating film 28. For example, doped polysilicon can be used for the gate electrode 30.

The interlayer insulating film 32 is provided on the gate electrode 30. The interlayer insulating film 32 is formed of, for example, a silicon oxide film.

The emitter electrode 134 is provided on the SiC layer 12. The emitter electrode 134 is electrically connected to the emitter region 118 and the p-base contact region 120. The emitter electrode 134 functions as a p-base electrode which applies a potential to the p-base region 116.

The emitter electrode 134 is a conductive material. The emitter electrode 134 is, for example, metal or metal silicide. The emitter electrode 134 has a lamination structure of, for example, a nickel silicide layer and an aluminum (Al) layer on the nickel silicide layer.

The collector electrode 136 is provided on a side opposite to the SiC layer 12 of the SiC substrate 110, specifically on a back face side. The collector electrode 136 is electrically connected to the SiC substrate 110.

The collector electrode 136 is a conductive material. The collector electrode 136 is, for example, metal or metal silicide. The collector electrode 136 has a lamination structure of, for example, a nickel silicide layer and a gold (Au) layer on the nickel silicide layer.

In the present embodiment, an n-type impurity is preferably such as N (nitrogen) and P (phosphorus). However, such as As (arsenic) or Sb (antimony) is applicable. Further, a p-type impurity is preferably such as Al (aluminum). However, such as B (boron), Ga (gallium), or In (indium) is applicable.

According to the IGBT of the embodiment, as with the MISFET of the first embodiment, a trade-off relation between a maximum electric field and an on-resistance in the gate insulating film 28 is improved. Therefore, a breakdown voltage of the gate insulating film 28 is increased. Further, punch-through in a channel region is suppressed, and a breakdown voltage between emitter collectors is increased. Accordingly, an IGBT having a high breakdown voltage can be realized.

In the first to fifth embodiments, a device in which an n-type and a p-type are inverted also can improve characteristics thereof.

In the embodiments, an example in which a crystal structure of silicon carbide is 4H—SiC has been described above. However, the present disclosure can be applied to such as 6H—SiC, 3C—SiC, and silicon carbide of other crystal structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a SiC substrate;
    a SiC layer provided on the SiC substrate, the SiC layer including a first trench at a side of front face of the SiC layer, the first trench including a side face and a bottom face;
    a first conductivity type first SiC region provided in the SiC layer;
    a second conductivity type second SiC region provided between the first SiC region and the SiC substrate in the SiC layer;
    a first conductivity type third SiC region provided between the second SiC region and the SiC substrate in the SiC layer, a boundary between the second SiC region and the third SiC region disposed at a side of the side face of the first trench, the boundary including a first region, a distance between the first region and the front face of the SiC layer increasing as a distance from the side face of the first trench to the first region increasing, a distance between the side face of the first trench to an end of the first region close to the first trench being 0 µm or more and 0.3 µm or less;
    a second conductivity type fourth SiC region provided on a side of the first SiC region in the SiC layer, the fourth SiC region having higher second conductivity type impurity concentration than that of the second SiC region;
    a gate insulating film provided on the side face and the bottom face of the first trench;
    a gate electrode, the gate insulating film disposed between the gate electrode and the first SiC region, the second SiC region, and the third SiC region;
    a first electrode provided on the front face of the SiC layer; and
    a second electrode, the SiC layer and the SiC substrate provided between the first electrode and the second electrode,
    wherein a minimum distance between the second electrode and the first trench is larger than a minimum distance between the second electrode and the second SiC region,
    a first distance between the first electrode and a boundary of the second SiC region and the fourth SiC region is smaller than a second distance between the boundary of the second SiC region and the fourth SiC region and the boundary of the second SiC region and the third SiC region,
    the first distance is measured on a line perpendicular to the front face of the SiC layer,
    the second distance is measured on the line, and
    the line crosses an interface between the fourth SiC region and the first electrode.

2. The device according to claim 1, wherein the first region contacts with the side face of the first trench.

3. The device according to claim 1, wherein the boundary of the second SiC region and the third SiC region includes a second region substantially parallel to the front face of the SiC layer, the second region is provided between the first region and the first trench, and the second region contacts with the side face of the first trench.

4. The device according to claim 1, wherein the first region has a first inclination angle with respect to the front face, and the first inclination angle is 15° or more and 70° or less.

5. The device according to claim 1, wherein the first region has a first inclination angle with respect to the front face, and the first inclination angle is 15° or more and 60° or less.

6. The device according to claim 1, wherein the boundary of the second SiC region and the third SiC region includes a bottom region substantially parallel to the front face, and the first region is provided between the bottom region and the first trench.

7. A semiconductor device, comprising:
    a SiC substrate;
    a SiC layer provided on the SiC substrate, the SiC layer including a first trench at a side of front face of the SiC layer, the first trench including a side face and a bottom face;
    a first conductivity type first SiC region provided in the SiC layer;
    a second conductivity type second SiC region provided between the first SiC region and the SiC substrate in the SiC layer;
    a first conductivity type third SiC region provided between the second SiC region and the SiC substrate in the SiC layer, a boundary between the second SiC region and the third SiC region disposed at a side of the side face of the first trench, the boundary including a first region, a distance between the first region and the front face of the SiC layer increasing as a distance from the side face of the first trench to the first region increasing, a distance between the side face of the first trench to an end of the first region close to the first trench being 0 µm or more and 0.3 µm or less;
    a gate insulating film provided on the side face and the bottom face of the first trench;

a gate electrode, the gate insulating film disposed between the gate electrode and the first SiC region, the second SiC region, and the third SiC region;

a first electrode provided on the front face of the SiC layer; and a second electrode, the SiC layer and the SiC substrate provided between the first electrode and the second electrode, wherein a minimum distance between the second electrode and the first trench is larger than a minimum distance between the second electrode and the second SiC region, and the boundary includes a side region substantially perpendicular to the front face of the SiC layer, and the first region is provided between the side region and the first trench.

8. The device according to claim 1, wherein the gate insulating film is an oxide film.

9. The device according to claim 1, wherein a film thickness of the gate insulating film on the bottom face of the first trench is thicker than a film thickness of the gate insulating film on the side face of the first trench.

10. The device according to claim 1, further comprising a second conductivity type fifth SiC region provided between the bottom face of the first trench and the third SiC region in the SiC layer, the fifth SiC region being in contact with the bottom face.

11. The device according to claim 1, further comprising the first electrode and the second electrode, the SiC layer and the SiC substrate provided between the first electrode and the second electrode, wherein the SiC layer includes a second trench at the side of front face of the SiC layer, the first SiC region is provided between the first trench and the second trench, and at least a part of the first electrode is disposed in the second trench.

12. The device according to claim 11, further comprising a second conductivity type fourth SiC region provided between a bottom face of the second trench and the third SiC region in the SiC layer, the fourth SiC region having higher second conductivity type impurity concentration than that of the second SiC region.

13. The device according to claim 1, wherein an interior angle of the second SiC region at the boundary is 90° or more.

14. The device according to claim 1, wherein the boundary of the second SiC region and the third SiC region does not includes a bending portion with an angle of 90° or less.

15. The device according to claim 1, wherein the first conductivity type is an n-type.

16. The device according to claim 1, wherein the SiC substrate is a first conductivity type.

17. The device according to claim 1, wherein the SiC substrate is a second conductivity type.

18. A semiconductor device, comprising:
a SiC substrate;
a SiC layer provided on the SiC substrate, the SiC layer including a first trench at a side of front face of the SiC layer, the first trench including a side face and a bottom face;
a first conductivity type first SiC region provided in the SiC layer;
a second conductivity type second SiC region provided between the first SiC region and the SiC substrate in the SiC layer;
a first conductivity type third SiC region provided between the second SiC region and the SiC substrate in the SiC layer, a boundary between the second SiC region and the third SiC region disposed at a side of the side face of the first trench, the boundary including a first region, the first region having a first position and a second position, the first position being closer to the first trench than the second position, a distance between the second position and the front face of the SiC layer being larger than a distance between the first position and the front face of the SiC layer, a distance between the side face of the first trench to an end of the first region close to the first trench being 0 µm or more and 0.3 µm or less;
a second conductivity type fourth SiC region provided on a side of the first SiC region in the SiC layer, the fourth SiC region having higher second conductivity type impurity concentration than that of the second SiC region;
a gate insulating film provided on the side face and the bottom face of the first trench;
a gate electrode, the gate insulating film disposed between the gate electrode and the first SiC region, the second SiC region, and the third SiC region;
a first electrode provided on the front face of the SiC layer; and
a second electrode, the SiC layer and the SiC substrate provided between the first electrode and the second electrode,
wherein a minimum distance between the second electrode and the first trench is larger than a minimum distance between the second electrode and the second SiC region,
a first distance between the first electrode and a boundary of the second SiC region and the fourth SiC region is smaller than a second distance between the boundary of the second SiC region and the fourth SiC region and the boundary of the second SiC region and the third SiC region,
the first distance is measured on a line perpendicular to the front face of the SiC layer,
the second distance is measured on the line, and
the line crosses an interface between the fourth SiC region and the first electrode.

19. A semiconductor device, comprising:
a SiC substrate;
a SiC layer provided on the SiC substrate, the SiC layer including a first trench at a side of front face of the SiC layer, the first trench including a side face and a bottom face;
a first conductivity type first SiC region provided in the SiC layer;
a second conductivity type second SiC region provided between the first SiC region and the SiC substrate in the SiC layer;
a first conductivity type third SiC region provided between the second SiC region and the SiC substrate in the SiC layer, a boundary between the second SiC region and the third SiC region disposed at a side of the side face of the first trench, the boundary including a first region, the first region having a first position and a second position, the first position being closer to the first trench than the second position, a distance between the second position and a back face of the SiC substrate being smaller than a distance between the first position and the back face of the SiC substrate, a distance between the side face of the first trench to an end of the first region close to the first trench being 0 µm or more and 0.3 µm or less;

a second conductivity type fourth SiC region provided on a side of the first SiC region in the SiC layer, the fourth SiC region having higher second conductivity type impurity concentration than that of the second SiC region;

a gate insulating film provided on the side face and the bottom face of the first trench;

a gate electrode, the gate insulating film disposed between the gate electrode and the first SiC region, the second SiC region, and the third SiC region;

a first electrode provided on the front face of the SiC layer; and a second electrode, the SiC layer and the SiC substrate provided between the first electrode and the second electrode, wherein a minimum distance between the second electrode and the first trench is larger than a minimum distance between the second electrode and the second SiC region, a first distance between the first electrode and a boundary of the second SiC region and the fourth SiC region is smaller than a second distance between the boundary of the second SiC region and the fourth SiC region and the boundary of the second SiC region and the third SiC region, the first distance is measured on a line perpendicular to the front face of the SiC layer, the second distance is measured on the line, and the line crosses an interface between the fourth SiC region and the first electrode.

20. The device according to claim 18, wherein the boundary of the second SiC region and the third SiC region includes a second region substantially parallel to the front face of the SiC layer, the second region is provided between the first region and the first trench, and the second region contacts with the side face of the first trench.

21. The device according to claim 19, wherein the boundary of the second SiC region and the third SiC region includes a second region substantially parallel to the front face of the SiC layer, the second region is provided between the first region and the first trench, and the second region contacts with the side face of the first trench.

22. The device according to claim 18, wherein the first region has a first inclination angle with respect to the front face, and the first inclination angle is 15° or more and 70° or less.

23. The device according to claim 19, wherein the first region has a first inclination angle with respect to the front face, and the first inclination angle is 15° or more and 70° or less.

24. The device according to claim 1, wherein no conductive material other than the gate electrode exists in the first trench.

25. The device according to claim 18, wherein no conductive material other than the gate electrode exists in the first trench.

26. The device according to claim 19, wherein no conductive material other than the gate electrode exists in the first trench.

27. The device according to claim 7, wherein the boundary includes a second region substantially parallel to the front face of the SiC layer, the second region is provided between the first region and the first trench, and the second region contacts with the side face of the first trench.

28. The device according to claim 7, wherein the first region has a first inclination angle with respect to the front face, and the first inclination angle is 15° or more and 70° or less.

29. The device according to claim 1, wherein a distance between the second electrode and the fourth SiC region is larger than a distance between the second electrode and the first trench.

30. The device according to claim 18, wherein a distance between the second electrode and the fourth SiC region is larger than a distance between the second electrode and the first trench.

31. The device according to claim 19, wherein a distance between the second electrode and the fourth SiC region is larger than a distance between the second electrode and the first trench.

* * * * *